(12) United States Patent
Ollier et al.

(10) Patent No.: US 10,563,319 B2
(45) Date of Patent: Feb. 18, 2020

(54) PROCESS FOR ELECTROCHEMICALLY MAKING AT LEAST ONE POROUS AREA OF A MICRO AND/OR NANOELECTRONIC STRUCTURE

(71) Applicant: COMMISSARIAT A L'ENERGIE ATOMIQUE ET AUX ENERGIES ALTERNATIVES, Paris (FR)

(72) Inventors: Eric Ollier, Grenoble (FR); Frederic-Xavier Gaillard, Voiron (FR); Carine Marcoux, Voiron (FR)

(73) Assignee: COMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 762 days.

(21) Appl. No.: 14/514,703

(22) Filed: Oct. 15, 2014

(65) Prior Publication Data
US 2015/0329986 A1    Nov. 19, 2015

(30) Foreign Application Priority Data
Oct. 16, 2013 (FR) ...................................... 13 60078

(51) Int. Cl.
*H01L 21/3065* (2006.01)
*C25F 3/02* (2006.01)
*C25F 3/12* (2006.01)

(52) U.S. Cl.
CPC . *C25F 3/12* (2013.01); *C25F 3/02* (2013.01)

(58) Field of Classification Search
CPC ........... C25F 3/12; C25F 3/02; H01L 21/3063
See application file for complete search history.

(56) References Cited

U.S. PATENT DOCUMENTS 6,001,679 A * 12/1999 Lin ..................... H01L 27/1112
                                                             257/E21.661
6,139,758 A   10/2000 Tu
(Continued)

FOREIGN PATENT DOCUMENTS

CN        1657401 A     8/2005
CN     101592578 A    12/2009
(Continued)

OTHER PUBLICATIONS

Combined Chinese Office Action and Search Report dated Feb. 22, 2017 in Patent Application No. 201410550919.8 (with partial English translation and English translation of categories of cited documents).
(Continued)

*Primary Examiner* — Thomas T Pham
(74) *Attorney, Agent, or Firm* — Oblon, McClelland, Maier & Neustadt, L.L.P.

(57) ABSTRACT

A process for making at least one porous area (ZP) of a microelectronic structure in at least one part of an conducting active layer (6), the active layer (6) forming a front face of a stack, the stack comprising a back face (2) of conducting material and an insulating layer (4) interposed between the active layer (6) and the back face (2), said process comprising the steps of:
  a) making at least one contact pad (14) between the back face (2) and the active layer (6) through the insulation layer (2),
  b) placing the stack into an electrochemical bath,
  c) applying an electrical current between the back face (2) and the active layer (6) through the contact pad (14) causing porosification of an area (ZP) of the active layer (6) in the vicinity of the contact pad (14),
  d) forming the microelectronic structure.

32 Claims, 27 Drawing Sheets

(56) References Cited

U.S. PATENT DOCUMENTS

| | | | |
|---|---|---|---|
| 6,200,878 | B1 | 3/2001 | Yamagata et al. |
| 6,500,348 | B2* | 12/2002 | Chase ................ G01P 15/0802 216/2 |
| 2004/0195096 | A1 | 10/2004 | Tsamis et al. |
| 2010/0006985 | A1* | 1/2010 | DeSouza .......... H01L 21/76245 257/647 |
| 2010/0147762 | A1* | 6/2010 | Zhang ................ B01D 67/0065 210/490 |
| 2011/0221013 | A1 | 9/2011 | Partridge et al. |
| 2012/0272742 | A1 | 11/2012 | Andreucci et al. |
| 2014/0162392 | A1 | 6/2014 | Ollier et al. |
| 2014/0357006 | A1 | 12/2014 | Ben Mbarek et al. |
| 2015/0021720 | A1 | 1/2015 | Ollier et al. |

FOREIGN PATENT DOCUMENTS

| | | |
|---|---|---|
| CN | 101592578 B | 12/2009 |
| CN | 102383177 A | 3/2012 |
| CN | 102618914 A | 8/2012 |
| CN | 102618914 B | 8/2012 |
| EP | 1 683 757 A1 | 7/2006 |

OTHER PUBLICATIONS

U.S. Appl. No. 13/384,474, filed Jul. 18, 2012, 2012-0272742, Andreucchi, et al.

U.S. Appl. No. 14/097,733, filed Dec. 5, 2013, 2014-0162392, Ollier, et al.

U.S. Appl. No. 14/182,659, filed Feb. 18, 2014, Ollier.

U.S. Appl. No. 14/286,175, filed May 23, 2014, 2014-0357006, Ben Mbarek, et al.

U.S. Appl. No. 14/335,175, filed Jul. 18, 2014, Ollier, et al.

U.S. Appl. No. 14/336,351, filed Jul. 21, 2014, 2015-0021720, Ollier, et al.

U.S. Appl. No. 14/514,703, filed Oct. 15, 2014, Ollier, et al.

S. Stolyarova et al., "Composite Porous Silicon-crystalline Silicon Cantilevers for Enhanced Biosensing", Sensors and Actuators B 131 (2008) pp. 509-515.

M.Saadoun et al., "Vapour-etching-based Porous Silicon: A new Approach", Thin Solid Films 405 (2002) pp. 29-34.

H. Föll et al., "Formation and Application of Porous Silicon", Materials Science and Engineering R 280 (2002) pp. 1-49.

R.E. Fernandez et al., "MEMS Composite Porous Silicon/ Polysilicon Cantilever Sensor for Enhanced Triglycerides Biosensing", IEEE Sensor, 2008, pp. 1468-1471.

R. L. Smith et al., "Porous Silicon Formation Mechanisms", Journal of Applied Physics, 71, Apr. 15, 1992, 23 pages.

U.S. Appl. No. 14/395,227, filed Oct. 17, 2014, Grange, et al.

French Preliminary Search Report dated May 7, 2014, in French Application No. 13 60078 filed Oct. 16, 2013 (with English Translation of Categories of Cited Documents).

S Ya Andrushin, et al., "Formation of porous silicon on a non-conductive substrate and its use as a sacrificial layer", Semiconductor Science and Technology, Institute of Physics Publishing Ltd, GB, vol. 20, No. 12, Nov. 15, 2005, 6 pgs.

* cited by examiner

FIG. 11O"

PROCESS FOR ELECTROCHEMICALLY MAKING AT LEAST ONE POROUS AREA OF A MICRO AND/OR NANOELECTRONIC STRUCTURE

TECHNICAL FIELD AND PRIOR ART

The present invention relates to a process for making at least one porous area of a microelectronic and/or nanoelectronic structure in at least one part of an electrically conducting or semi-conducting layer, said porous area being formed electrochemically.

Microelectronic devices and microsystems, comprising MicroElectroMEchanical (NEMS) and NanoElectroMEchanical (NEMS) Systems are commonly utilized in numerous everyday life products.

For some of these systems, it is interesting to make porous layers. Depending on the applications, it will be attempted to use particular properties of these porous materials, for example their chemical absorption capacity which can be implemented in chemical, biological, moisture sensors, etc., their heat insulation capacity, electrical insulation capacity, optical properties, etc.

In NEMS and MEMS, semi-conducting materials are largely used, in particular silicon.

Porous elements or parts of porous elements which are used in numerous NEMS and MEMS are of porous semi-conducting material, more particularly of porous silicon.

There are numerous processes for forming porous silicon at the surface of a silicon substrate or of MEMS structures in highly varied configurations, and also processes for making MEMS type movable structures entirely of porous silicon or partly covered with porous silicon on some of their surfaces.

It is known to make suspended mechanical structures entirely of porous silicon or to form only one porous layer on an element of porous silicon. For example Document EP 1 683 757 describes a process for making an MEMS comprising a step of making a layer of porous silicon through electrochemical etching. This porosification process requires an electrical current to flow between the back faces, and the front face where the porous silicon of the substrate is desired to be formed. This process thus implies to start from an electrically conducting substrate. Consequently, this process cannot be implemented on substrates comprising an insulating layer, such as SOI (Silicon on Insulator) substrates. But, this type of substrate is very often used to manufacture micro and nanoelectronic systems.

Document "*Composite porous silicon-crystalline silicon cantilevers for enhanced biosensing*" S. Stolyarova, S. Cherian, R. Raiteri, J. Zeravik, P. Skladal, Y. Nemirovsky, *Sensors and Actuators B* 131 (2008) 509-515 describes a transducer comprising a cantilever type beam of porous silicon. It is made from an SOI substrate. The porous silicon is formed by exposing the single crystal silicon to vapours which porosify it by etching it. This technique is sometimes called "stain-etching". It is also described for example in Document "*Vapour-etching-based porous silicon formation*", M. Saadoun, N. Mliki, H. Kaabi, K. Daoubi, B. Bessais, H. Ezzaouia, R. Bennaceur, *Vapour-etching-based porous silicon: a new approach*, *Thin Solid Films* 405 (2002) 29-34. This technique, also called Reactive Induced Vapour Phase Stain Etch (RIVPSE), consists in exposing the substrate to vapours produced by the silicon etching in a $HF:HNO_3:CH_3COOH$ mixture. This process does not require an electrical current to flow between both faces of the substrate. On the other hand, this process does not enable the process to be well controlled in terms of formation speed of the SiP (porous silicon), porosity rate, pore diameter, etc.

On the contrary, the electrochemical etching process, also called "anodization technique", is much better controlled. It relies on the fact that porosification is achieved by the anodic dissolution in the presence of hydrofluoric acid. This process enables formation speed of the SiP, porosity rates, pore diameters, etc. to be well-controlled. It is capable of offering different porosities (microporous/pore diameter <2 nm, mesoporous/pore diameter between 2 nm-50 nm, macroporous/pore diameter >50 nm), particular orientations of the pores, etc. Anodization conditions (HF concentration, current density, time) as well as the doping (N or P type, concentration of dopants) of the substrate enable the characteristics of the porous layer to be controlled. But, as indicated above, this process requires an electrical current to flow between the back face and the front face of the substrate on which a porosity is desired to be made, which explains why it cannot be simply implemented on substrates comprising an insulating layer, as the SOI substrates. Thus, this porosification process uses a so-called bulk substrate, i.e. entirely of conducting or semi-conducting material and not comprising an insulation layer.

There are exemplary embodiments of surfaces of porous silicon on substrates, for example SOI ones, by transfer of layers based on attachment techniques for example molecular bonding. But these are expensive techniques and which are not easily applicable for the implementation on micro and nanoelectronic structures, in particular in the case where the porous area(s) is (are) desired to be located.

DISCLOSURE OF THE INVENTION

Consequently, one purpose of the present invention is to provide a process for making at least one porous area of a microelectronic and/or nanoelectronic structure in at least one part of an electrically conducting or semi-conducting layer carried by a conducting or semi-conducting support and separated from the same by an electrically insulating layer, the porous area being formed electrochemically.

The previously set forth purpose is achieved by a process comprising a step of making at least one electrical connection between the conducting or semi-conducting layer forming the front face and the conducting or semi-conducting support forming the back face, through the insulating layer prior to forming the porous area in the conducting layer and the step of porosification by electrochemical etching of at least one part of the conducting or semi-conducting layer.

This electrical connection between the front face and the back face enables an electrical current to flow between both these faces and thus the front face to be electrochemically etched in order to make at least one part of the front face porous.

Preferably, several electrical connections are made between the front face and the back face through the substrate, allowing a better control of the porosity of the area to be formed.

Advantageously, the electrical connection of the plurality of electrical connections is formed by contact blocks of conducting or semi-conducting material through the insulating material.

In an exemplary embodiment, the structure is formed from an SOI substrate. Preferably, the electrical contact(s) is/are then made through epitaxy. In another exemplary embodiment, the process consists, from a stack of at least one back face forming conducting or semi-conducting layer and an insulating layer, in making one or more etchings in the insulating layer and then forming the contact pad(s) and the active layer, whether simultaneously or not.

The electrical connection between the conducting layer and the carrying substrate can be kept in the final system. Preferably, the electrical connection(s) is (are) interrupted, which enables several microelectronic or nanoelectronic structures of a same device to be electrically insulated or then devices made on the same substrate to be insulated. The removal of the electrical connection(s) can be achieved for example by at least partially etching the contact pad(s) or by cutting off the contact pads.

One subject-matter of the present invention is thus to provide a process for making at least one porous area in at least one part of an active layer of conducting or semi-conducting material of a microelectronic and/or nanoelectronic structure, said active layer forming a front face of a stack, said stack comprising a back face of conducting or semi-conducting material and an electrically insulating layer interposed between the active layer and the back face, said process comprising the steps of:

a) making at least one electrical contact between the back face and the active layer by forming at least one contact block of electrically conducting or semi-conducting material through the insulating layer, b) placing the stack into an electrochemical bath, c) applying an electrical current between the back face and the active layer through the contact block so as to cause porosification of at least one area of the active layer The contact block may be formed from the front face and/or from the back face.

The making process can advantageously comprise, after step c), a step d) of forming the microelectronic and/or nanoelectronic structure from the active layer, for example through etching the active layer.

This forming step can comprise one or more steps selected from doping, structuring, epitaxy, contact recovery of the active layer. In the embodiment where the contact is removed, step d) can be performed before, after or during this step of removing the contact.

Preferably, the stack is an SOI substrate.

In one embodiment, the electrical contact between the active layer and the back face is removed after step (c). The step of removing the electrical contact can be achieved by at least partially withdrawing the contact block so as to remove a mechanical contact between the active layer and/or the back face and the contact block.

According to an exemplary embodiment, the contact block can be partially etched and/or the active layer is etched around the contact block.

Step d) can comprise a sub-step of etching the active layer and wherein at least partially withdrawing the contact block takes place simultaneously to etching the active layer.

According to another exemplary embodiment, the contact block is withdrawn by sawing.

In one embodiment, step a) comprises making at least one hole through the stack between the back face and the active layer, through the insulation layer and filling said hole with an electrically conducting or semi-conducting material so as to form the contact block making an electrical contact between the back face and the active layer.

The step of filling said hole with an electrically conducting or semi-conducting material is achieved preferably by selective or non-selective epitaxy, electrolysis or CVD type deposition. Advantageously, it is a selective epitaxy, which enables only the space of the contact block to be filled.

In another embodiment, prior to step a), at least one hole is made in the insulation layer reaching the back face and during step a), the active layer and the contact block are simultaneously formed onto the insulating layer and in the hole respectively.

Forming the active layer and the contact block can be performed through epitaxy. For example, it is a silicon epitaxy from a silicon support.

Preferably, the material of the contact block and that of the active layer are the same.

In an exemplary embodiment, during step a), several distinct contact blocks are made in proximity to the area to be porosified. Advantageously, these contact blocks form a discontinuous outline around the area to be porosified.

In another exemplary embodiment, during step a), a single contact block having a closed outline is made, the area to be porosified being inside and/or outside the closed outline.

During step a), a single contact block having a discontinuous outline is made, the area to be porosified being inside and/or outside the discontinuous outline, or a plurality of contact blocks bounding an area between each other is made, the area to be porosified being inside and/or outside said area.

For example, during step c), the entire surface of the active layer is porosified and/or the active layer is porosified throughout its thickness.

In another example, prior to step c), a location layer is formed at least on the active layer to bound at least one area of the active layer to be porosified.

Advantageously, in the case where a microelectronic and/or nanoelectronic structure is made, contact blocks surround the area wherein the microelectronic and/or nanoelectronic structure is made.

The microelectronic and/or nanoelectronic structure can comprise at least one suspended part and a fixed part, the porous area can then be formed at least partly on the suspended part and possibly at least partly on the fixed part. The suspended part can be movable or not.

The contact block can be made in an area between the fixed part and the suspended part.

Step d) can comprise making interconnections on the active layer comprising the sub-steps of:

forming a dielectric layer on the porous area and on the active layer, forming a mask on the dielectric layer etching the mask and the dielectric layer up to reach the active layer, forming and structuring a conducting material in the etchings to form the interconnections.

When the process comprises a step of releasing a mechanical structure, the withdrawal of the mask and the dielectric layer can take place during the final release of the mechanical structure.

Forming the conducting material is for example performed by full wafer deposition of the conducting material and lithography of said material to form the interconnections and possibly connecting lines or by etching by chemical mechanical polishing the conducting material so as to keep the conducting material only in etchings.

The stack can comprise one or more layers in the back face and the insulating layer such that an electrical continuity between the back face and the active layer is ensured after step a).

In the case where the process is intended to make several microelectronic and/or nanoelectronic structures, the contact blocks are made between the areas wherein the microelectronic and/or nanoelectronic structures are made.

The electrical contact between the active layer and the back face can then be removed after step c) by separating the microelectronic and/or nanolectronic structures.

The separation of the microelectronic and/or nanoelectronic structures is for example achieved by sawing, by two saw cuts on either side of the contact pads so as to separate the contact blocks from the microelectronic and/or nanoelectronic structures or by a saw cut having a width at least equal to the transverse dimension of the contact blocks.

BRIEF DESCRIPTION OF THE DRAWINGS

The present invention will be better understood using the description that follows and the appended drawings wherein.

DETAILED DISCLOSURE OF PARTICULAR EMBODIMENTS

Different devices that can be obtained by the process according to the present invention will be first described, and then different exemplary making processes according to the invention will be described thereafter.

In the description that follows, the exemplary processes described generally comprise a step of structuring the active layer and releasing the structured part, but a process wherein the active layer would not be structured and/or the structured part would not be released does not depart from the scope of the present invention.

Figure 1:
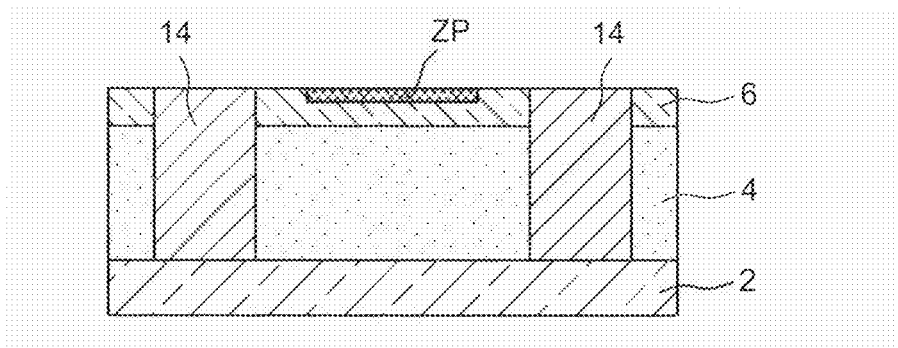
FIG. 1 is a schematic representation of a general stack provided with contact pads obtained according to the process according to the invention.

The devices are made in a layer of electrically conducting or semi-conducting material 6, which forms the front face of a stack comprising a support or bulk substrate 2, and a layer of dielectric material 4 interposed between the bulk substrate 2 and the layer 6. The layer 6 will be later referred to as "active layer" for the sake of simplicity. This stack is represented in FIG. 1. The "support" substrate is made of an electrically conducting or semi-conducting material.

For example, the active layer 6 and the support substrate 2 can be made of:

a semi-conducting material, such as Si, Ge, SiGe, etc., in a single crystal, polycrystalline, amorphous form, a metal such as Al, W, or even Cu, Au, compounds or multilayers of the preceding materials (semi-conductors and metals).

The semi-conducting materials can be of the P-type or N-type and can have different doping levels. Preferentially, they are of the $P^+$-type. The doping and its implementation will be described upon describing the making processes.

The dielectric layer 4 can be BOX of an SOI substrate. Alternatively, they can be of other types of oxide, for example silicon oxide of the CVD, PVD, ICVD type, etc.

It could be of nitride, for example silicon nitride, or even of doped semi-conductor so as to provide insulation with the other semi-conductors surrounding this layer.

A microelectronic and/or nanoelectronic structure according to the invention is a mechanical structure comprising at least one sensitive part, this sensitive part can be a suspended element, wherein this suspended element can be movable or not. A reference to "sensitive part" does not restrict the invention to the field of sensors. The sensitive part is understood in the present application as an "active part" having a particular function with respect to the rest of the device. The structure can comprise or not actuating means and/or transducing means and/or measuring means. Such a structure can form a transistor type structure, a magnetic type, optical type structure.

In the description that follows, the microelectronic and/or nanoelectronic structure(s) will be referred to as NEMS for the sake of simplicity. The term NEMS applies to unit NEMS as well as networks of NEMS comprising one or more metal interconnection levels.

In the description that follows, the devices comprise suspended parts. But it will be understood that the invention enables devices without suspended parts to be made.

The terms "upper" and "lower" refer to the orientation of the drawings with respect to the sheet and are in no way limiting, wherein the devices represented can have any orientation in space.

The process according to the invention provides for making at least one electrically conducting path 14 through the insulating layer 4 separating the support substrate 2 from the active layer 6 in order to make at least one part of the active layer 6 porous (FIG. 1).

By "a porous material", it is meant in the present application a material which has cavities (pores) in its volume and/or on its surface. The pore diameter can be between a few nm and several tens or even hundreds nm, with porosity rates of a few percents to 80%-90%. Preferentially, these pores can gather so as to have an open porosity, or not so as to have a closed porosity.

The porous area, referred to as ZP, formed in the active layer can extend on all or part of the surface of the active layer 6 and on all or part of the thickness of the active layer 6. Further, the porous area can have no constant thickness.

Figure 2A:
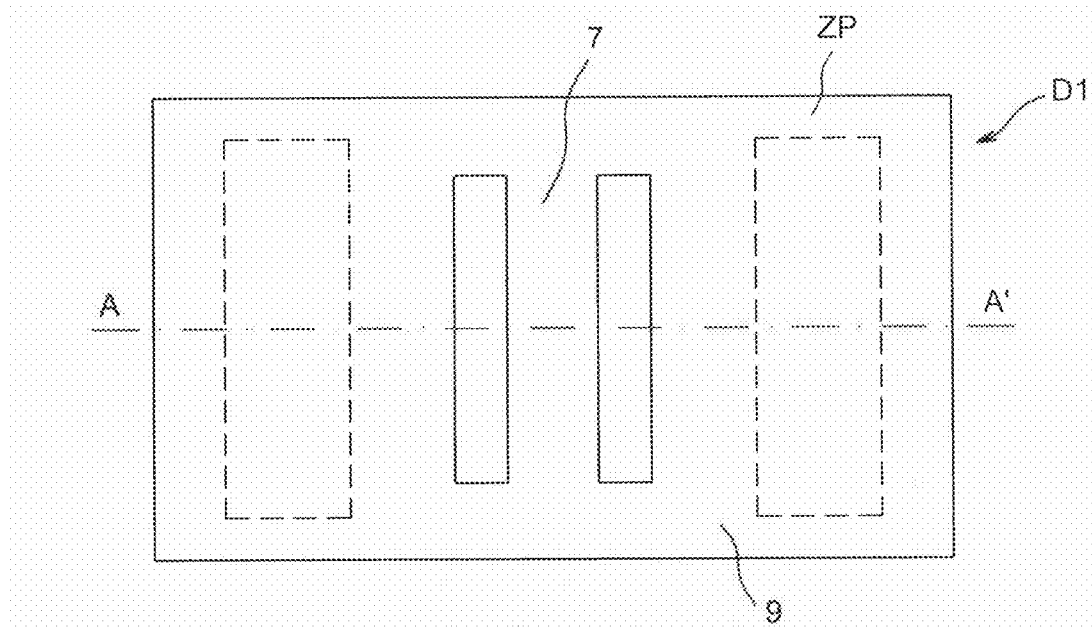
FIGS. 2A and 2B are top and cross-section views along the plane A-A' respectively of an exemplary structure that can be obtained by virtue of the process according to the invention, wherein the porous area is not located.
Figure 2B:
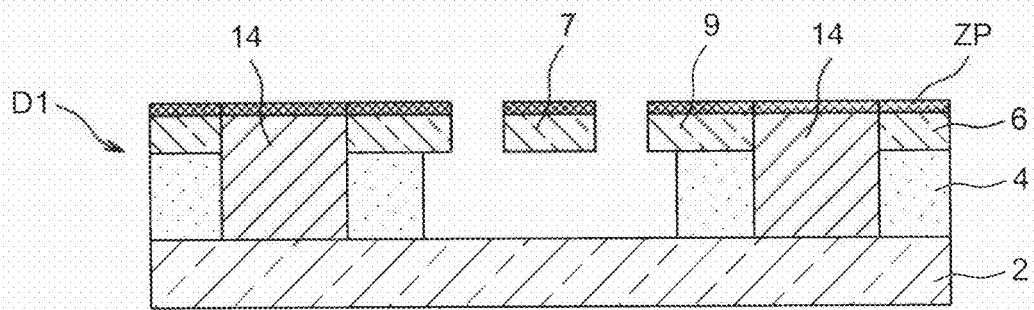

In FIGS. 2A and 2B, a first exemplary device D1 obtained by virtue of the present invention can be seen. This comprises an NEMS formed in the active layer 6. The upper surface of the active layer 6 has been porosified and forms the porous area ZP. The porous area forms the entire front face of the device (FIG. 2A). Thus, the suspended part 7 and the fixed part 9 both comprise a porous upper face. This porous area ZP is referred to as "non-located porous area".

In this example, the suspended part 7 is in the form of a beam embedded at both its ends.

The device D1 comprises two contact blocks 14 that have been used for forming the porous area electrochemically. The contact blocks 14 are located on either side of the suspended part 7. In the example represented, they have the shape of a rectangular parallelepiped the greater length of which extends parallel to the longitudinal axis of the suspended part 7.

The contact blocks 14 are electrical conductors and are of metal or semi-conductor and can comprise one or more metals and one or more semi-conductors for example layered ones. The contact blocks are used for conducting the electrical current between the support substrate 2 and the active layer 6 for porosifying at least one part of the active layer 6 by an electrochemical process.

In the device D1, the electrical contact between the support substrate 2 and the active layer 6, more particularly with the NEMS, is kept.

Figure 3:
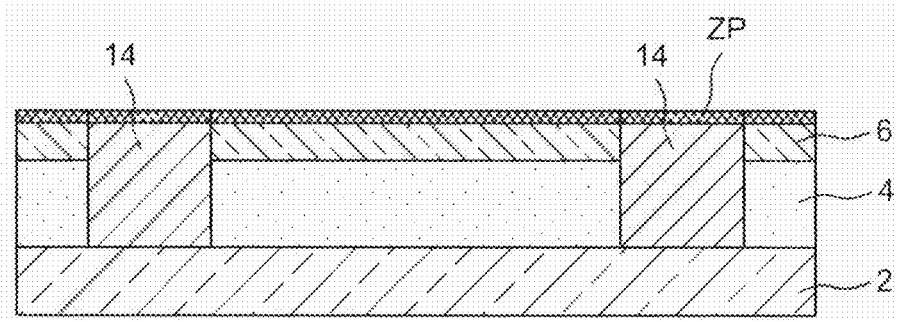
FIG. 3 is a cross-section view of the structure of FIG. 2A before releasing the suspended part in the case of a subsequent releasing.

In FIG. 3, the stack comprising the contact blocks 14 and the non-located porous area ZP can be seen before structuring the NEMS and release thereof. It is to be noted that, depending on the applications, the stack of FIG. 3 could be operational and the manufacturing process could be ended.

Figure 4A:
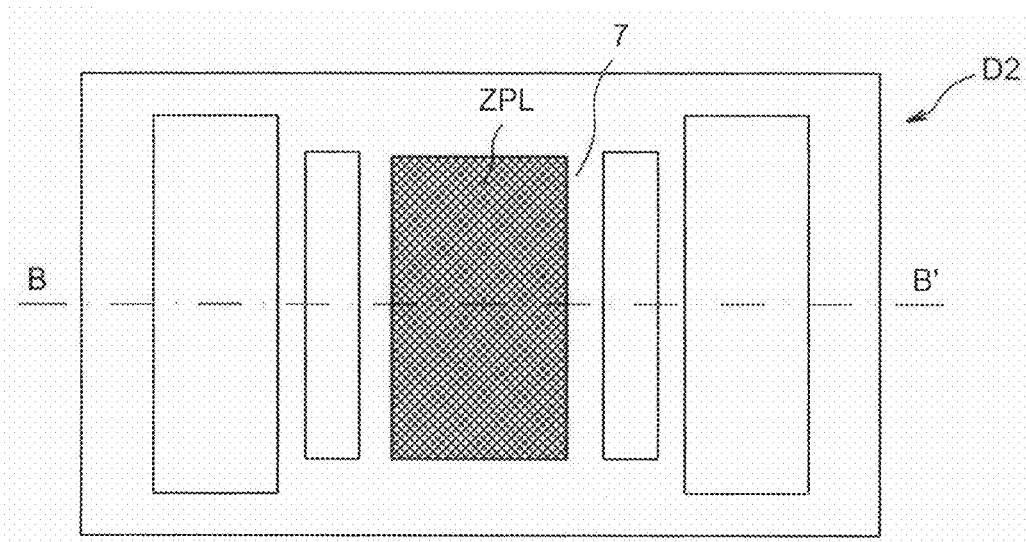
FIGS. 4A and 4B are top and cross-section views along the plane B-B' respectively of an exemplary structure that can be obtained by virtue of the process according to the invention, wherein the porous area is located.
Figure 4B:
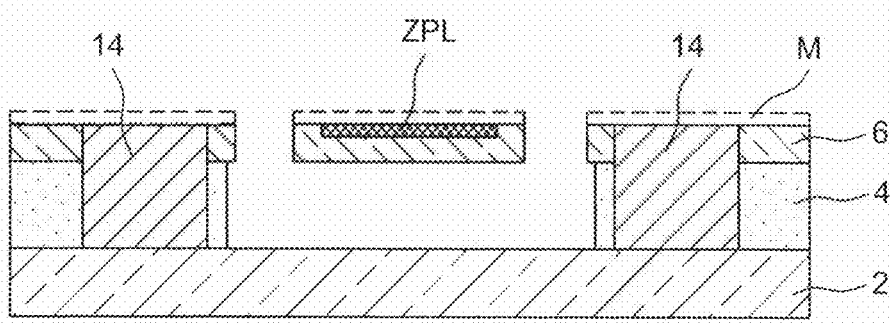

In FIGS. 4A and 4B, another example of making the device D2 obtained by virtue of the present invention can be seen, wherein the porous layer ZPL is located.

In this example, the porous area ZPL forms only a part of the upper face of the suspended part 7. The contact blocks 14 have shapes and arrangements with respect to the suspended part which are similar to those of the suspended part of the device D1. In this example also, the electrical contact between the NEMS and the support substrate 2 is kept by means of the contact blocks 14. The located porous area ZPL has been obtained thanks to the implementation of a locating mask M which is symbolized by a dotted line, wherein the latter has been withdrawn.

Figure 5A:
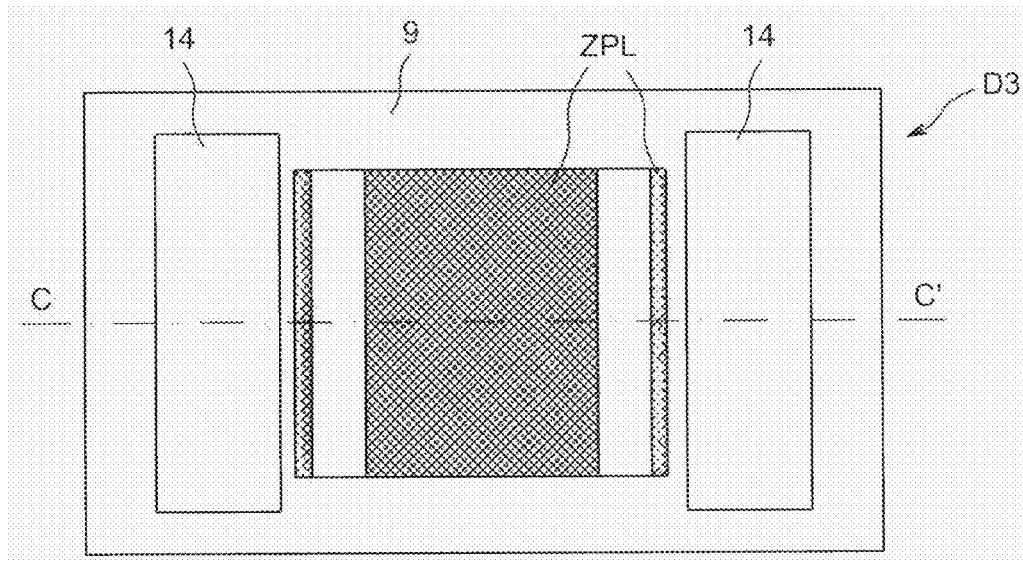
FIGS. 5A and 5B are top and cross-section views along the plane C-C' respectively of another exemplary structure that can be obtained by virtue of the process according to the invention, wherein the porous area is located.
Figure 5B:
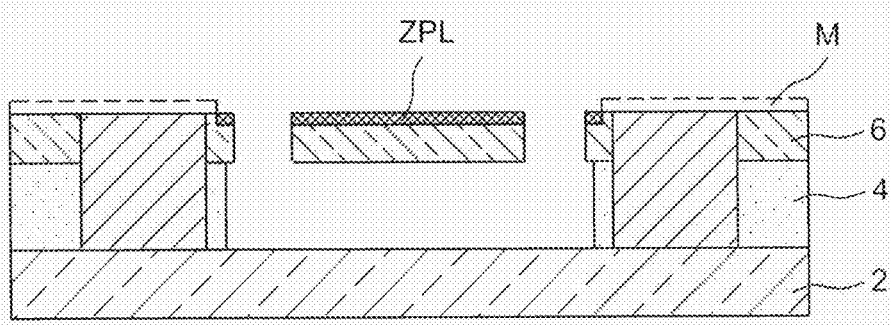

In FIGS. 5A and 5B, another example of making the device D3 obtained by virtue of the present invention can be seen, wherein the porous layer ZPL is also located. The device D3 differs from the device D2 in that the located porous area is both present on the suspended part 7 and on the fixed part 9 of the NEMS. In this example, the entire upper face of the suspended part 7 is porous. Alternatively, it could be contemplated that only part of the upper face be porous. Further, the porous area is present on the fixed part 9 on either side of the active part 7 with respect to its longitudinal axis, but it could be contemplated that it lies for example only on one side of the movable part. The mask M used for locating the porous area is also represented by a dotted line.

In this example also, the electrical contact by means of the contact blocks 14 between the NEMS and the support substrate 2 is kept. The contact blocks 14 have shapes and arrangements with respect to the suspended part which are similar to those of the contact blocks of the device D1.

Figure 6A:
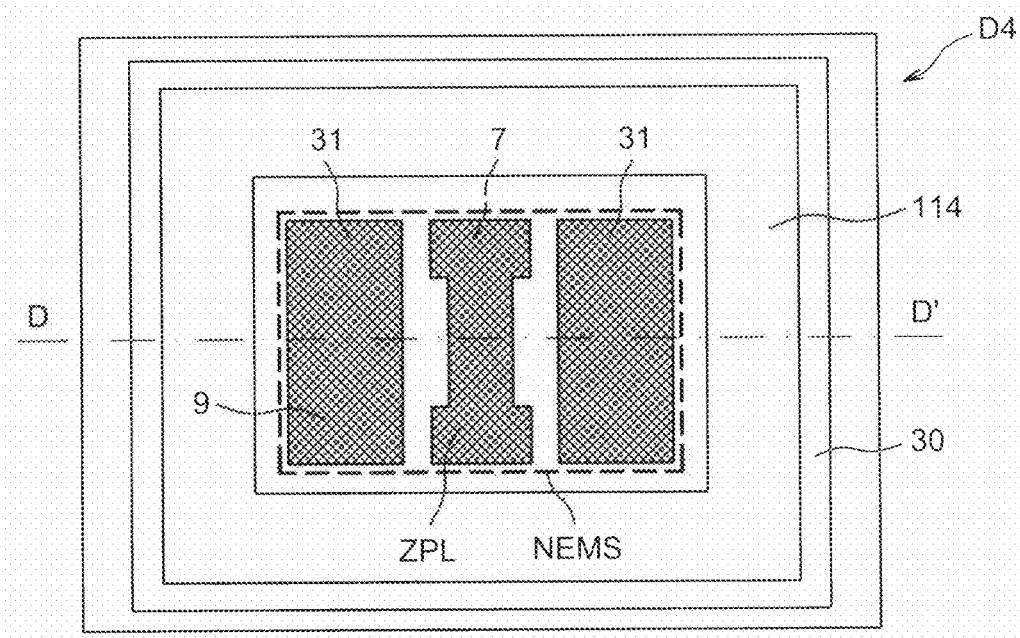
FIGS. 6A and 6B are top and cross-section views along the plane D-D' respectively of another exemplary structure that can be obtained by virtue of the process according to the invention, wherein the porous area is not located and the electrical contact between the back face and the active face is removed.
Figure 6B:
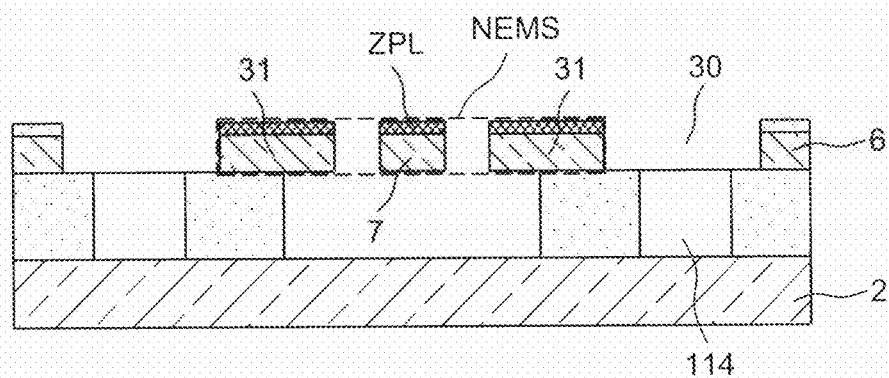

In FIGS. 6A and 6B, another example of making the device D4 obtained by virtue of the present invention can be seen, wherein the electrical contact between the support layer 2 and the NEMS has been removed after the porous area has been formed.

In this example, the porous area ZP is not located.

In this exemplary embodiment, the device D4 comprises a single contact block 114 having a transverse cross-section of a rectangular frame shape and surrounds the MEMS structure, the pad passing through the active layer 6, the dielectric layer 4 is in mechanical contact with the support substrate 2.

The device further comprises on its front face a trench 30 by surrounding an NEMS structure and having a depth and a width such that making the trench removes any mechanical contact between the contact block 114 and the active layer 6, thus electrically insulating the NEMS structure from the contact block 114 and thus the NEMS structure from the support substrate 2.

The trench 30 has a width greater than the width of the contact block and a depth higher than the thickness of the active layer.

This electrical insulation between the NEMS structure and the support substrate 2 is interesting for example to insulate different NEMS from a same device or different mechanical structures from a same device or even different devices which would be collectively made on a same substrate.

This trench 30 forms an electrically insulating area being insulating between the NEMS structure and the contact block 114.

This trench can be left empty or filled with an electrically insulating material; for example identical to that of the insulating layer 4. The filling of the trench enables a planar surface to be kept at the surface of the device allowing, for example, metal interconnection levels to be added, a cap to close the structure to be sealed, another device to be hybridized offering a further function, etc. This filling also enables the insulation between the active layer and the substrate to be ensured regardless of the medium wherein the device will be finally placed, comprising if the latter has conductive characteristics.

The shape of the trench depends on the shape of the contact block. It has a shape and dimensions such as that it removes any direct contact between the active layer and the contact block. In the case of several contact blocks, it could be contemplated making a single trench for all the blocks or distinct etchings in order to insulate each contact block from the active layer 6 or to insulate the blocks by group.

In the examples represented, the electrical insulation between the NEMS structure and the support substrate 2 is achieved by removing the contact between the NEMS and the contact block. It is contemplatable to make this electrical insulation by interrupting the contact between the support substance and the contact block, for example by making a trench in the back face.

In a variant, it can be contemplated electrically insulating the NEMS structure and the support substrate 2 to apply a processing to the contact block(s) to switch them from a conducting state to an insulating state. For example, in the case of a semi-conductor pad, particular dopings by diffusion or implantation for example can be made, the latter enabling a current flow to be blocked, possibly through the use of bias voltages. Structures of the PN-junctions, diodes, transistors types for example could thus be formed.

The device D4 comprises a suspended part 7 the longitudinal ends of which have a transverse dimension higher than a centre part of the suspended part 7. These ends having a higher width act as anchors to the suspended part having a lower width.

In this example, electrodes 31 are formed on the fixed part on either side of the movable part 7 and facing the side flanks of the suspended part, for example for detecting its displacement and/or moving it by electrostatic forces. The suspended part 7 is thus movable.

Figure 7A:
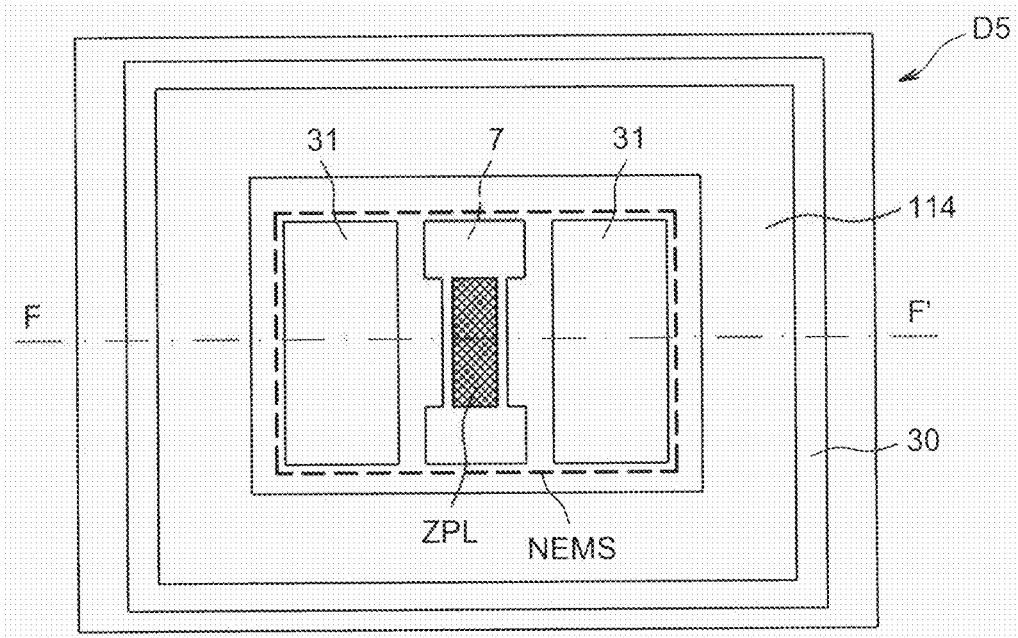
FIGS. 7A and 7B are top and cross-section views along the plane F-F' respectively of an exemplary structure that can be obtained by virtue of the process according to the invention, wherein the porous area is located and the electrical contact between the back face and the active face is removed.
Figure 7B:
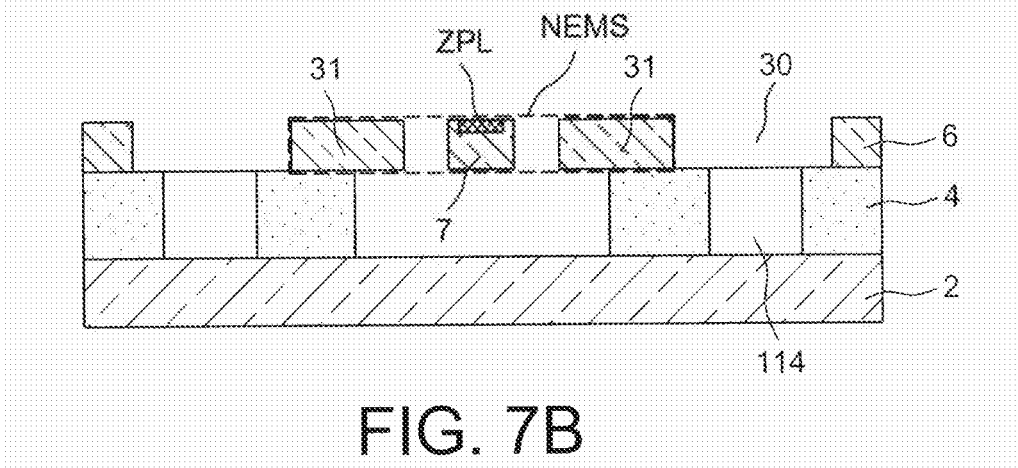

In FIGS. 7A and 7B, another example of making the device D5 obtained by virtue of the present invention can be seen, wherein the contact between the NEMS and the support substance 2 is interrupted and which comprises a porous area ZPL only located on the suspended part 7.

As for the device D5, a trench surrounds the NEMS structure and removes the contact between the active layer 6 and the contact block 114.

Figure 8A:
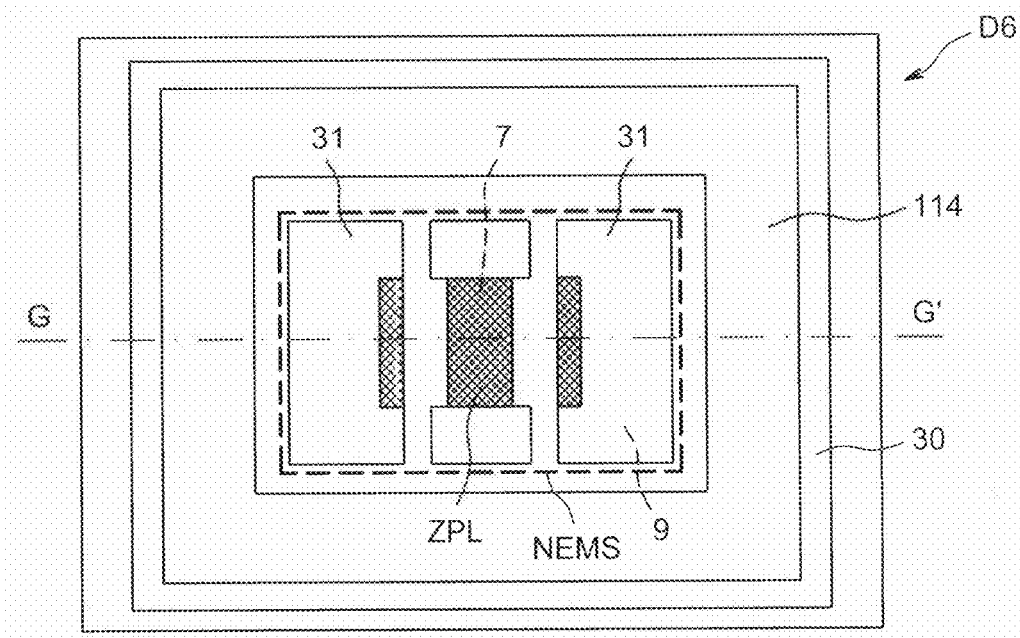
FIGS. 8A and 8B are top and cross-section views along the plane G-G' respectively of another exemplary structure that can be obtained by virtue of the process according to the invention, the porous area being located and the electrical contact between the back face and the active face being removed.
Figure 8B:
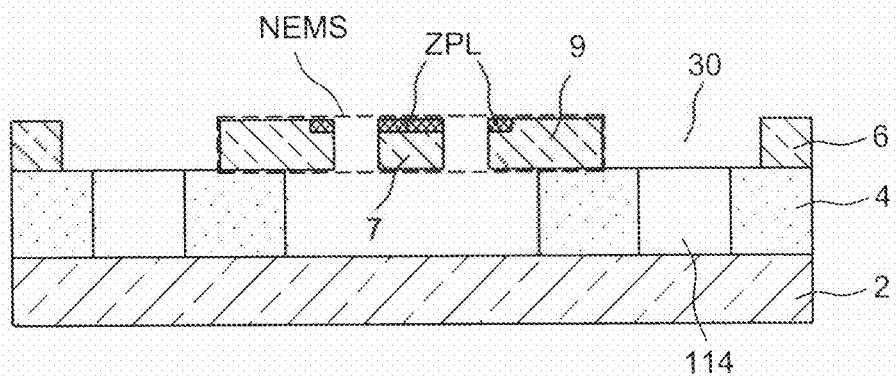

In FIGS. 8A and 8B, another example of making the device D5 obtained by virtue of the present invention can be seen, wherein the contact between the NEMS and the support substance 2 is interrupted and which comprises a porous area ZPL located on part of the suspended part 7 and on the fixed part 9 on either side of the suspended part 7. As for the device D5, a trench surrounds the NEMS structure and removes the contact between the active layer and the contact block 114.

Figure 6C:
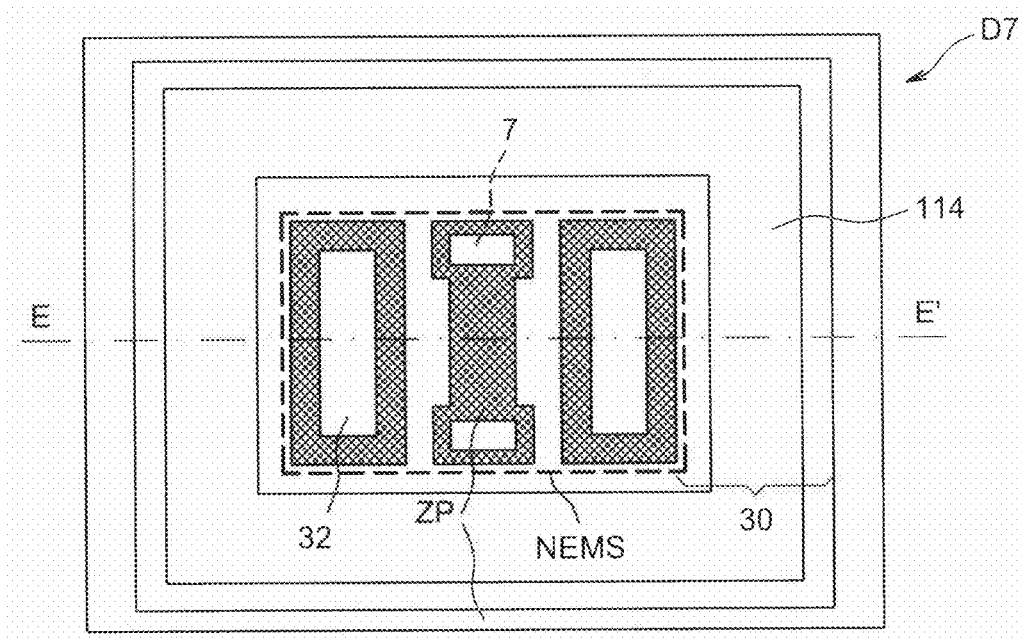
FIGS. 6C and 6D are top and cross-section views along the plane E-E' respectively of an alternative device of FIGS. 6A and 6B wherein metal bondings have been formed on the micro or nanoelectronic structure.
Figure 6D:
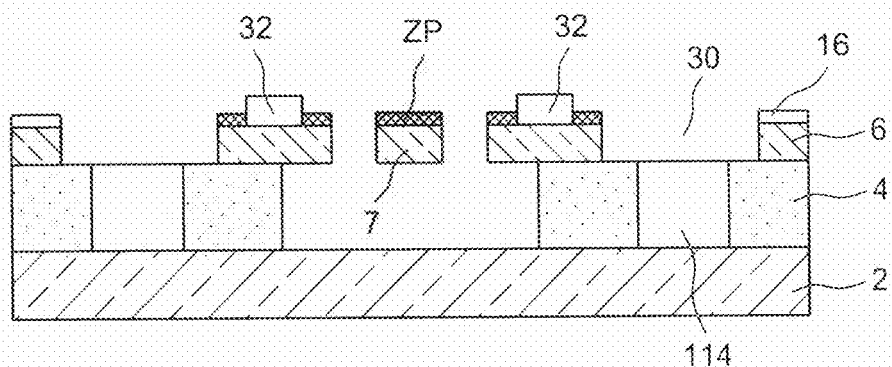

In FIGS. 6C and 6D, an alternative D7 of the device D4 can be seen, wherein metal bondings 32 are made on the suspended part 7 and on the fixed part 9 in order to allow an electrical connection with the environment for example by making metal interconnections and/or electrical contact pads.

Figure 9A:
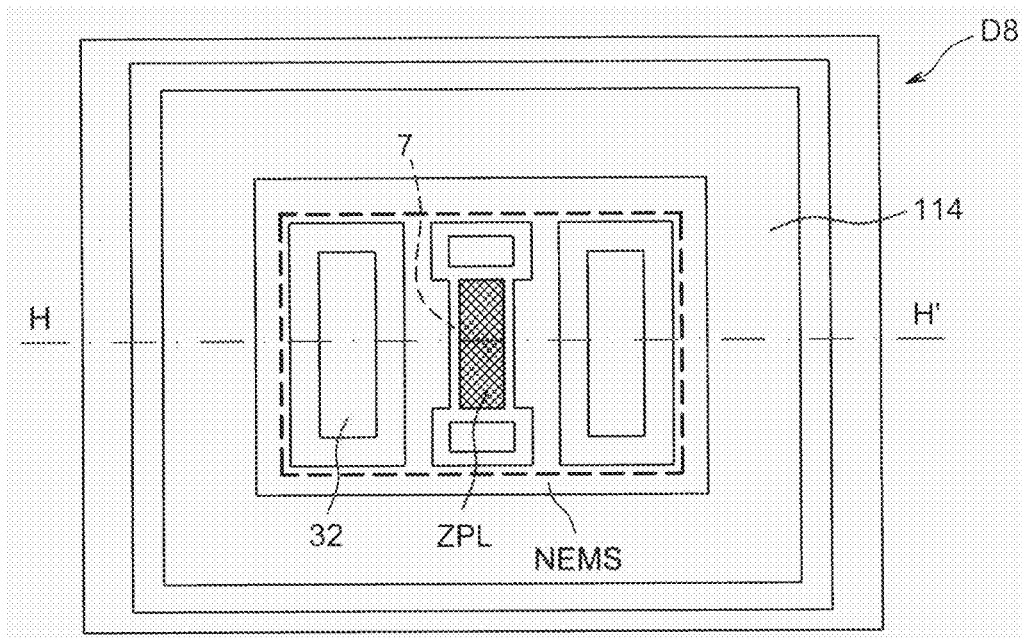
FIGS. 9A and 9B are top and cross-section views along the plane H-H' respectively of an alternative device of FIGS. 7A and 7B wherein metal bondings have been formed on the micro or nanoelectronic structure.
Figure 9B:
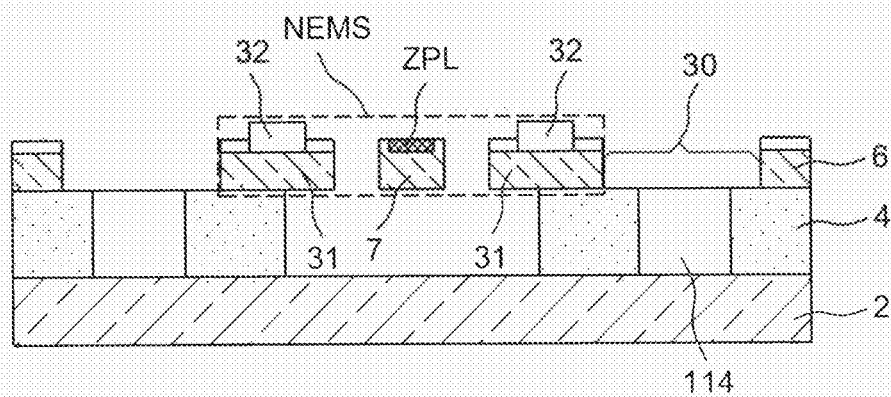

In FIGS. 9A and 8B, an alternative D8 of the device D5 can be seen, wherein metal bondings 32 are made on the suspended part 7 and on the fixed part 9 in order to allow an electrical connection with the environment for example by making metal interconnections and/or electrical contact pads.

Figure 10A:
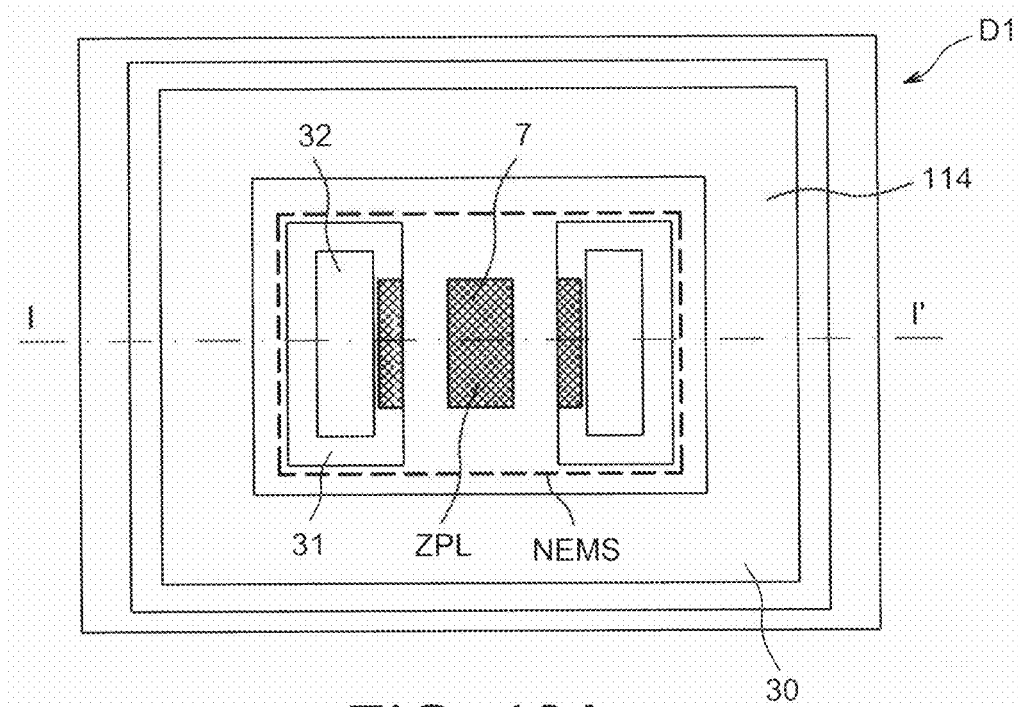
FIGS. 10A and 10B are top and cross-section views along the plane I-I' respectively of an alternative device of FIGS. 8A and 8B wherein metal bondings have been formed on the micro or nanoelectronic structure, FIGS. 11A to 11O'' are schematic representations of different steps of an exemplary making process according to the invention.
Figure 10B:
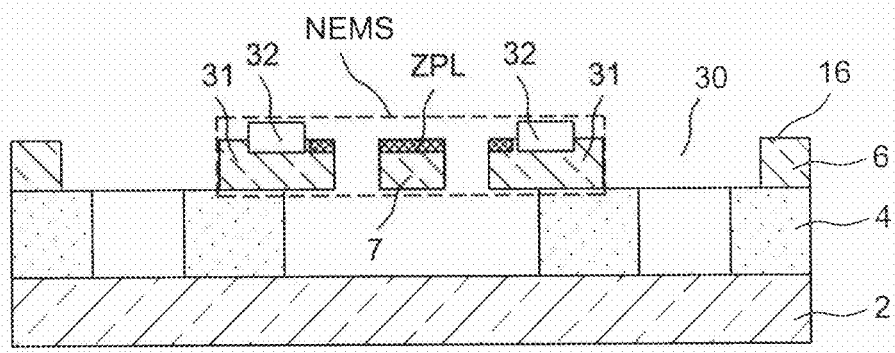

In FIGS. 10A and 10B, an alternative D9 of the device D6 can be seen, wherein metal bondings 32 are made on the suspended part 7 and on the fixed part 9 in order to allow an electrical connection with the environment for example by making metal interconnections and/or electrical contact pads.

Exemplary contact block(s) will now be described in detail.

As described above, one or more contact blocks can be implemented to provide for current flow between the back face and the front face of the stack.

The block or the plurality of contact blocks can have various geometric shapes. In FIGS. 15a to 15L, exemplary contact blocks 14, 114 as seen in a top view are represented. They can have in a top view a square, rectangular, circular, polygonal shape (FIGS. 15A to 15D respectively) or any shape. Their transverse dimensions can be a few tens nm to a few μm or tens μm. The values of the transverse dimensions are selected as a function of the thickness of the active layer 6 and the dielectric layer 4.

Figure 15A:
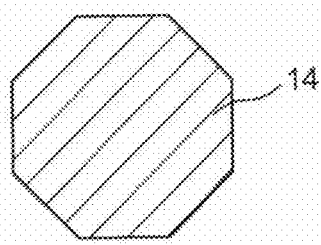
FIGS. 15A to 15L are top views of different exemplary shapes of contact blocks that can be implemented in the process according to the invention.
Figure 15B:
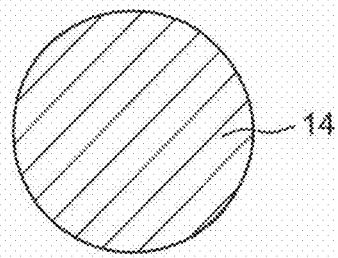
Figure 15C:
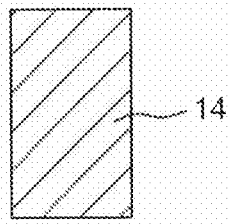
Figure 15D:
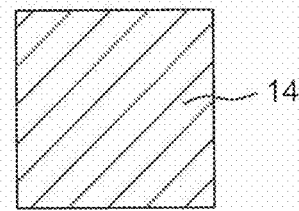
Figure 15E:
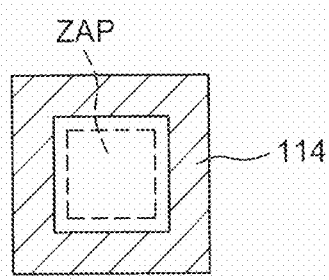
Figure 15F:
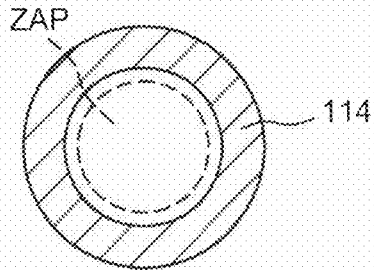
Figure 15G:
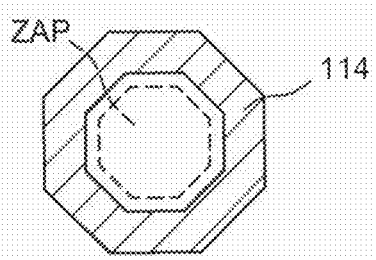

The contact pads 114 can also be in a frame shape (FIGS. 15E to 15G). Advantageously, the frames surround the area to be porosified being referred to as ZP. This frame shape has the interest, by surrounding the area to be porosified, of obtaining even characteristics of the porous area, these characteristics being for example the thickness, the nature of the material, the pore dimension and distribution, etc. It is to be noted that the porous area can be inside and/or outside the frame(s). If the area to be porosified only lies inside the frame, a mask is preferably used to protect the area outside the frame during the porosification step.

Figure 15H:
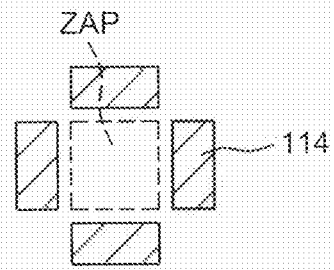
Figure 15I:
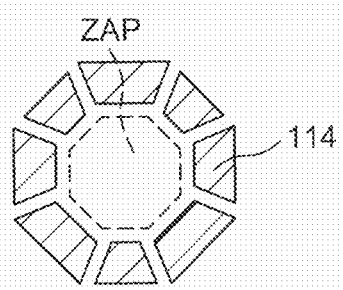
Figure 15J:
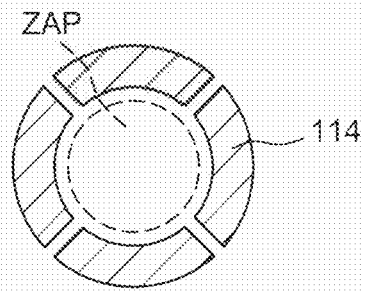

In FIGS. 15E to 15G, the frames 114 are continuous around the area to be porosified. In a variant, as is represented in FIGS. 15H to 15J, the frames can be discontinuous.

Figure 15K:
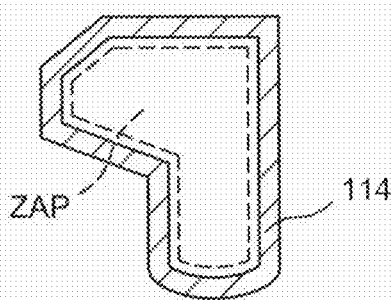
Figure 15L:
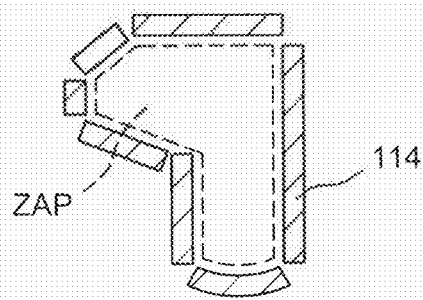

Besides, the frames 114 can have any shape as is represented in FIGS. 15K and 15L, this shape can advantageously be suitable for the shape of the area to be porosified. Preferentially, the distance between the edge of the area to be porosified and the edge of the frame is constant and the frame width is also preferably constant, which allows even characteristics of the porous area to be ensured in the area to be porosified. Besides, the shape and position of the contact blocks take advantageously account of the integration process, in particular with respect to the interconnection levels. It is to be noted that generally the porosification phenomenon is better controlled in the centre of the area bounded by the contact block(s) than on the rest of the active layer.

For example, the device D4 represented in FIGS. 6A and 6B comprises a single contact block forming a closed frame, but this contact block could be replaced by a plurality of juxtaposed blocks distributed so as to form a frame. For example, the device could comprise four rectangular parallelepiped shaped contact blocks provided at right angles with respect to each other so as to bound a rectangular frame or else be formed by a plurality of pads having a square, rectangular, circular, polygonal shape or any shape.

Preferably, the contact blocks have a reasonable aspect ratio (height/width ratio). The block height, and thus the depth of the etching to be performed, is the sum of the thickness of the layer 6 and the layer 4. The block width is its transverse dimension as seen in a top view of the device.

Preferably, the width of the contact blocks is of the same value or higher than their height, to allow the pattern to be easily etched and the filling thereof to be facilitated, for example through epitaxy. Thus, an aspect ratio of 1 (block height equal to the width thereof) facilitates the technological creation, but according to the type of etching and/or filling, much higher aspect ratios (for example in the order of 10, that is a depth equal to ten times the width) may be contemplated.

In an exemplary embodiment, the contact blocks can be distributed only on the periphery of the area to be porosified, or about each NEMS away from the area to be porosified or even within the area to be porosified, for example in the case of a porosification of the entire upper face of the stack.

It may be contemplated making several distinct porous areas, each being made by means of a contact block or a group of contact blocks.

Preferably, the contact blocks are made as close as possible to the area to be porosified which allows a well-controlled process and in particular a high thickness homogeneity of the porous area to be ensured.

Preferably also, the current density which passes through the block or the plurality of contact blocks is evenly distributed with respect to the area to be porosified. Indeed, the nature of the porous material which will be formed depends on the current density which will pass through the contact blocks during the porosification phase. This density depends on the electrical conductivity of the contact blocks, for example and on the geometric dimensions of the patterns, therefore among other things on the doping of the semi-conducting materials intervening in the electrical conduction between the back face and the layer to be porosified at the front face, i.e. the material of the layer 6, that of the support 2, and that of the contact pad made between both these layers, on the dimension of the electrical contact blocks, the dimension of the openings in the location mask of the area to be porosified which will be described below.

When a located porous area is made, the contact blocks are advantageously disposed with respect to the area to be porosified at close distances, preferably at equal distances from the area to be porosified to ensure a good homogeneity in the porosity and thickness of the porosified area.

The distance between the contact block(s) and the area desired to be porosified is selected so as to prevent the thickness of the porous material formed in the area close to the contact from becoming equal to the thickness of the active layer in this area before the porous material has been formed in the desired area. Indeed, this would result in blocking the flow of carriers towards the surface to be porosified. For example, for a thickness of the active layer 6 of 200 nm, the contact blocks may be placed at a distance advantageously lower than a few mm from the areas to be porosified, and preferably, at a distance between a few tens µm and a few hundreds µm.

In the case of active layers having a thickness of a few µm to a few tens µm, for example in MEMS structures, the distance between the contact blocks and the area to be porosified may be in the order of one centimetre.

Figure 11A:
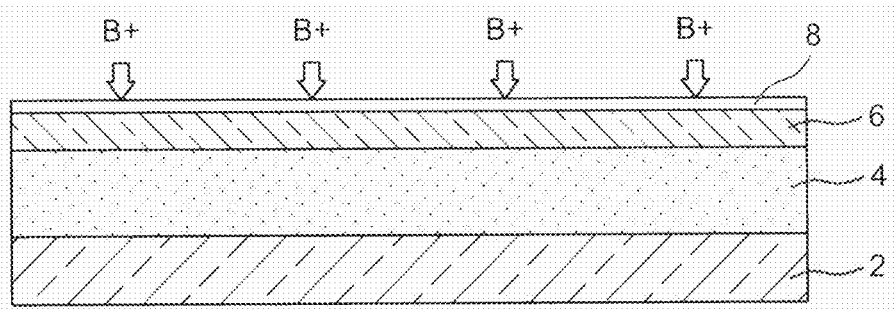
Figure 11B:
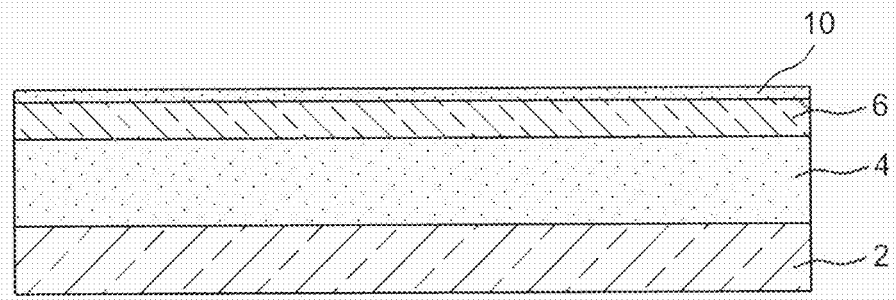
Figure 11C:
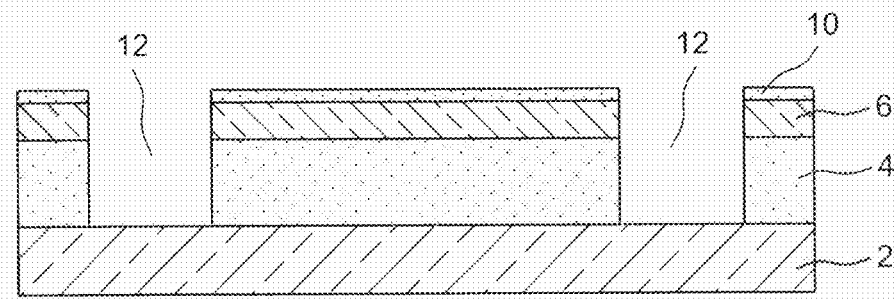
Figure 11D:
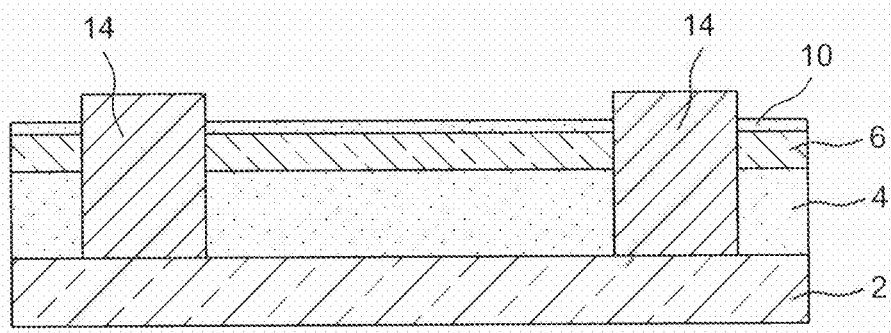
Figure 11E:
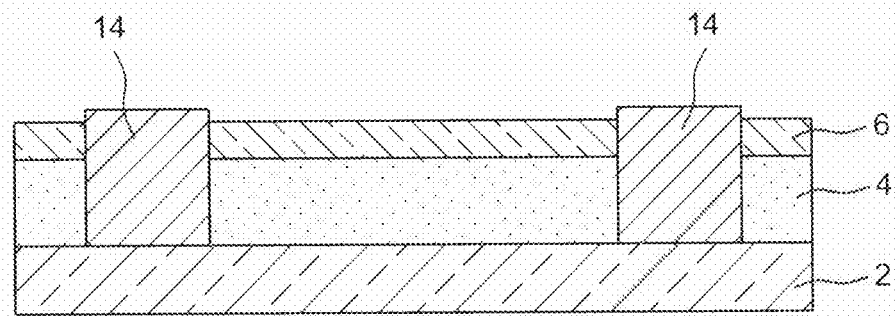
Figure 11F:
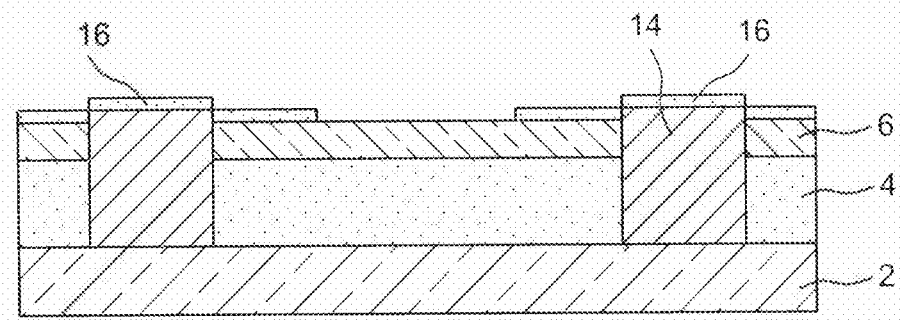
Figure 11G:
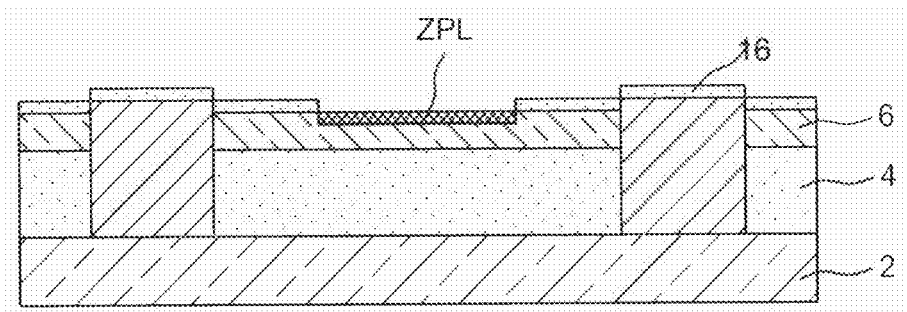
Figure 11H:
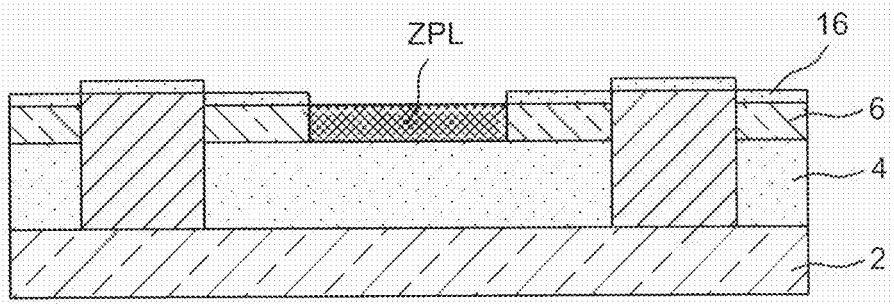
Figure 11I:
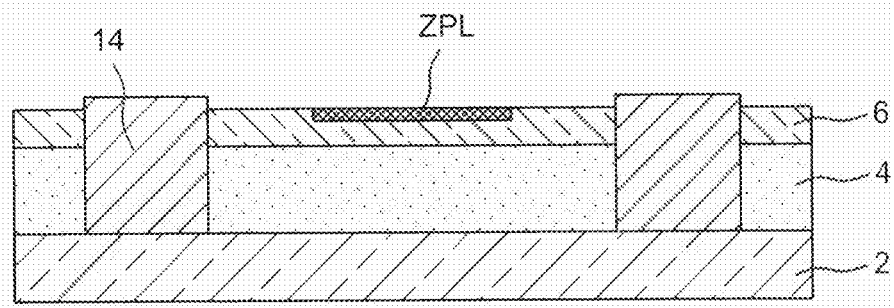
Figure 11J:
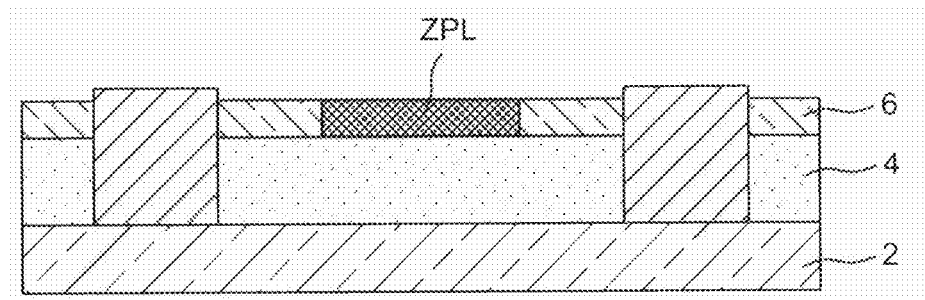
Figure 11K:
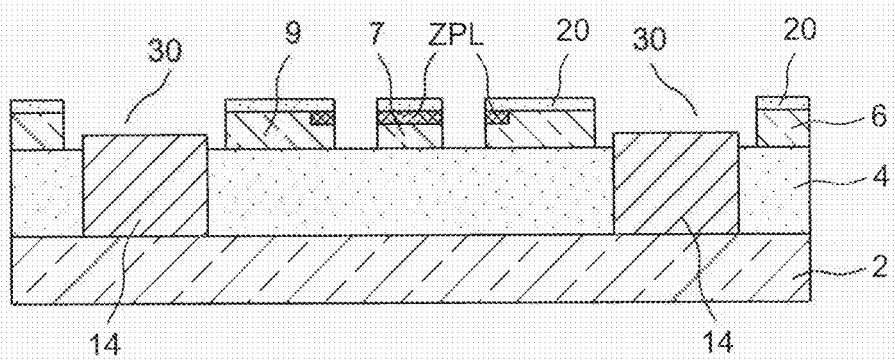
Figure 11L:
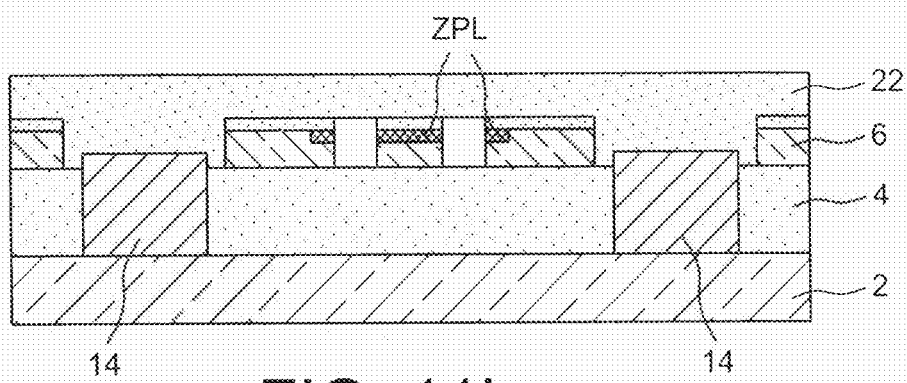
Figure 11M:
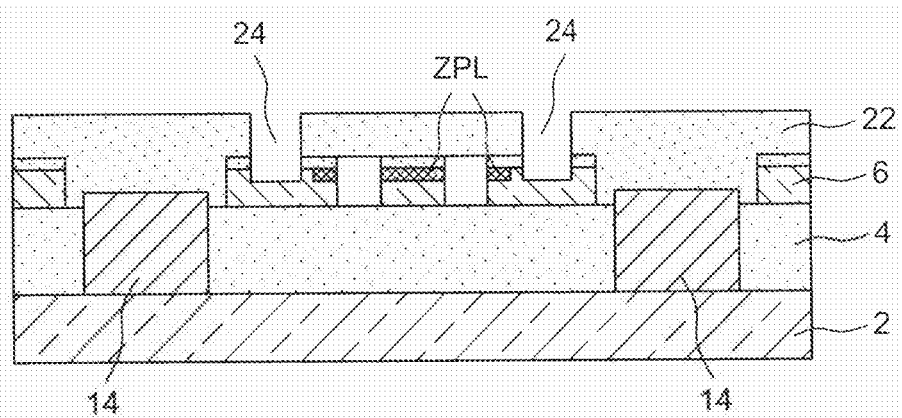
Figure 11N:
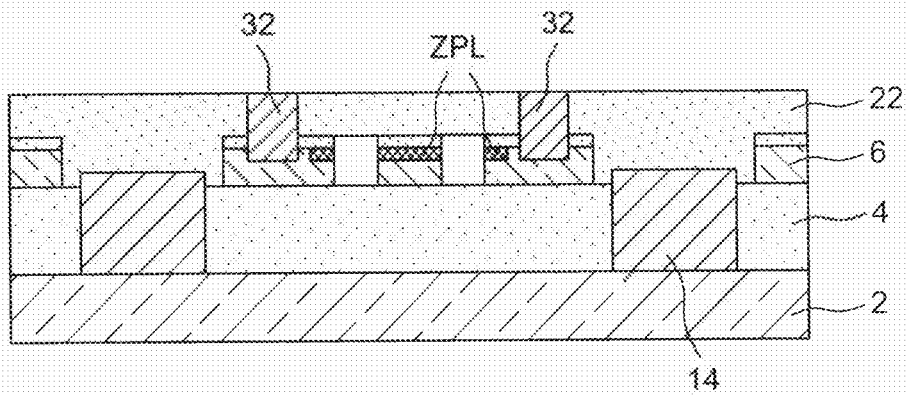
Figure 11O:
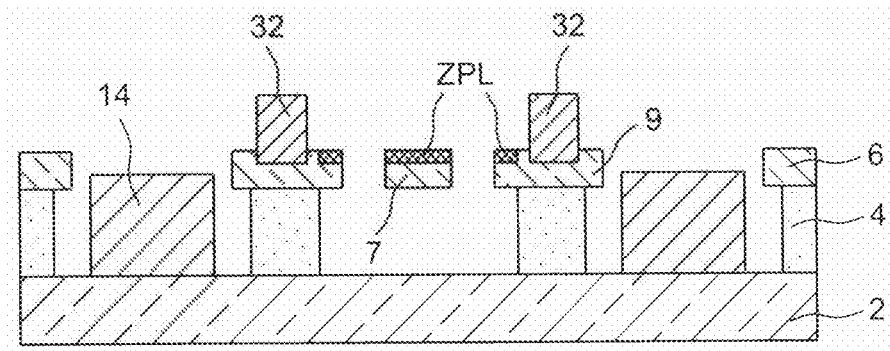

In FIGS. 11a to 11O" are schematically represented different steps of an exemplary making process. This exemplary process enables a mechanical structure comprising a suspended part to be made.

In this example, there is at first an SOI substrate comprising a support layer 2 forming the back face, a layer of dielectric material 4 and a silicon layer 6 forming the front face. For example, the layer 6 has a thickness between 10 nm and 500 nm, or even several µm or even several tens µm. The dielectric layer 4 is for example a BOX (Buried Oxide) layer the thickness of which is for example between 10 nm and 500 nm, even several µm. The support layer, also called "bulk", is for example of silicon.

A step of implanting the layer 6 can take place, the implantation can be either full wafer, or located to make preferential dopings in some areas, preferably through a protecting layer 8, for example of silicon oxide the thickness of which is for example in the order of 10 nm, formed beforehand. For example, a Boron doping with a dopant concentration in the order of a few $10^{18}$ atoms/cm$^3$ to a few $10^{19}$ atoms/cm$^3$ at the mechanical structure or even higher at the areas which will then be used to recover electrical contacts. The implantation step is symbolized by the arrow B+.

Preferably, after the implantation step, annealing steps at temperatures between 800° C. and 1100° C. are performed.

The layer 8 can then be withdrawn.

The doping can be of the P- or N-type with different doping levels. Preferentially for a P+-doping, Boron or Gallium is used as a dopant at a concentration between about $10^{18}$ at/cm$^3$ and about $10^{19}$ at/cm$^3$; for a N+-doping, Phosphorus or Arsenic can be used as a dopant at a concentration between $10^{18}$ at/cm$^3$ and about $10^{19}$ at/cm$^3$.

Alternatively, in the case where a low doping is desired to be performed, techniques of illuminating the back face of the substrate can be used, to generate carriers during the porosification step.

The support layer 2 can be of N-type or P-type semi-conductors.

The element thus obtained is represented in FIG. 11A.

During the following step, a layer 10 forming a hard mask on the active layer 6 is formed for making electrical contacts between the active layer 6 and the back face 2. This hard mask is for example of dielectric material, for example a silicon oxide of a few microns thickness.

Advantageously, it can be provided that the oxide layer 8 used for implantation acts as a hard mask, which advantageously prevents the layer 8 from being withdrawing and a new layer to form the mask from being deposited.

By making the hard mask 10 of silicon oxide whereas the support substrate is of silicon, it is then possible to make the contact blocks by selective epitaxy during the step of filling the contact blocks as will be described in detail below. The layer 10 could alternatively be made of silicon nitride SiN, or even titanium nitride TiN.

The element thus obtained is represented in FIG. 11B.

During the following step, at least one etching 12 is made in the element of FIG. 11B from the front face, which reaches the support layer 2. A contact block will be formed in this etching.

The shape, number and arrangement of the etchings will be described in the continuation of the description.

For example, a photolithography is performed on the layer 10 to bound areas to be etched.

Then successive, preferably anisotropic etchings are performed, for example dry etchings such as a Reactive-Ion Etching (RIE) of the hard mask 10, the active layer 6 and the layer 4, up to the support layer 2.

During a following step, the resin deposited onto the hard mask for the photolithography is withdrawn.

The element thus obtained is represented in FIG. 11C.

During a following step, the contact blocks 14 are formed in the etchings 12.

Preferably, the contact blocks 14 are made by Si epitaxy such that the epitaxied material makes the electrical contact between the support layer 2 and the layer 6. The silicon is preferably of the same nature as that of the active layer. Preferably, the epitaxy is performed so as to obtain a slight extra-thickness above the hard mask 10, which enables a full filling of the etchings to be ensured.

The epitaxy is preferentially a selective epitaxy, it enables the etchings 12 to be filled without thickening the silicon layer 6 wherein the NEMS structure will be made thereafter. The implementation of a non-selective epitaxy is contemplatable. Then a step of planarization of the layer 6 is provided in order to obtain a planar face, for example by a Chemical Mechanical Planarization (CMP) process. In this case, the hard mask of oxide could be used to stop this step without interfering with the surface of the layer 6.

In a variant, the contact blocks 14 can be made of a different material from that of the layer 6. They can be made in any conducting material, for example metals or semiconductors. The contact blocks could also be made of polysilicon for example by deposition.

Furthermore, the contact blocks could be made by other techniques, such as Chemical Vapour Deposition (CVD), by Physical Vapour Deposition (PVD), by evaporation, by spraying.

In a variant, it could be contemplated making the contact blocks by forming several layers of conducting materials in the etchings. A filled part can thus comprise several layers giving a sufficient electrical conductivity.

The element thus obtained is represented in FIG. 11D.

During a following step, a planarization of the contact blocks 14 is performed for example by chemical mechanical polishing with a stop on the hard mask, and the hard mask 10 is then withdrawn for example by isotropic etching. Alternatively, the planarization of the contact blocks can take place after the hard mask is withdrawn.

The element thus obtained is represented in FIG. 11E.

During a following step, the area(s) of the front face 6 which is/are desired to be made porous is/are bounded.

For this, a mask 16 is formed on the front face which will locate the porosification treatment of silicon.

The mask is for example of silicon nitride formed for example by Plasma-Enhanced Chemical Vapour Deposition (PECVD), preferably at a temperature of 350° C. This temperature enables dopings previously made not to be impacted.

During a following step, the locating mask 16 is opened for making accessible the areas of the front face 6 to be porosified. The opening of the locating mask 16 is for example made by photolithography.

The thickness of the mask 16 is selected as a function of the depth at which the layer 6 is desired to be porosified. For example, the mask 16 has a thickness of a few hundreds nm to achieve a porosification on a depth of a few hundreds nm.

In a variant, the locating mask can be made of deposited silicon oxide having a good selectivity to silicon, upon withdrawing the mask. It can be for example a TEOS (tetraethylorthosilicate) oxide formed at 400° C.

The element thus obtained is represented in FIG. 11F.

During a following step, the porosification of the area of the layer 6 bounded by the mask 16 is performed.

This porosification step is made electrochemically by imposing an electrical current flow between the layer 6 and the support layer 2, the movements of the current carriers being made possible between both layers by the presence of the contact block(s).

The porosification by electrochemical way is performed by disposing the element of FIG. 11F in a bath allowing the electroporosification of the silicon wafer. The silicon acts as an anode and is submerged for example in a hydrofluoric acid solution under a determined electrical current. It is well-known to those skilled in the art that porous silicon can be obtained electrochemically or photo-electrochemically, and more precisely by an anodic dissolution in a hydrofluoric acid medium, from a silicon layer. Within this scope, the sample of silicon to be porosified is submerged in a hydrofluoric acid medium having a concentration than can typically vary from 1% to 50% depending on several types of configuration (below).

The porosification technique by electrochemical way is for example described in document *Silicon Porosification: State of the Art*, G Kototcenkov & B K Cho, in *Critical Reviews in Solid State and Materials Sciences* 35:153-260, 2010.

Figure 16A:
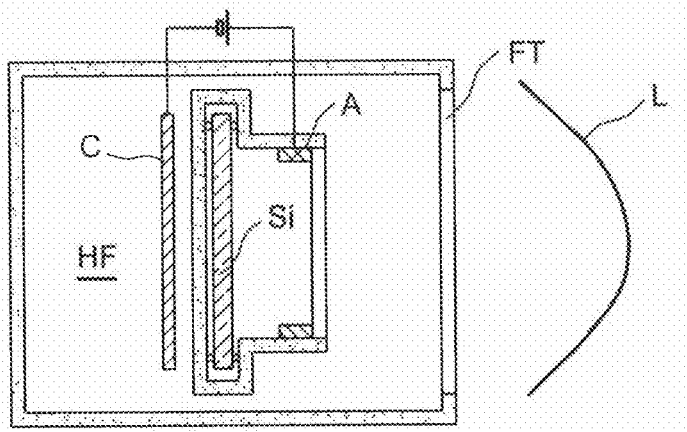
FIGS. 16A to 16C are schematic representations of the different electrochemical etching facilities that can be implemented for performing the process according to the invention.
Figure 16B:
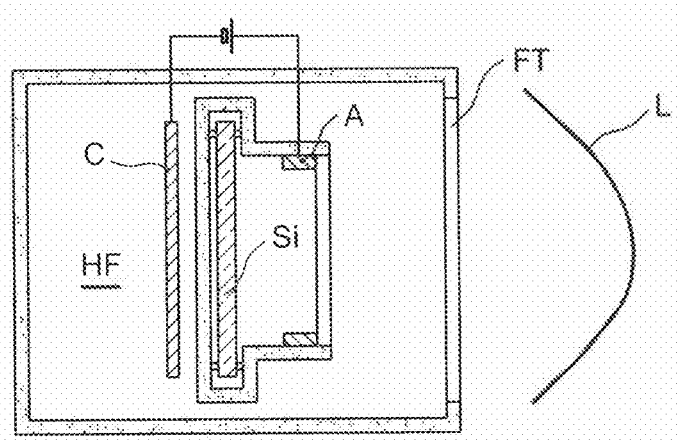
Figure 16C:
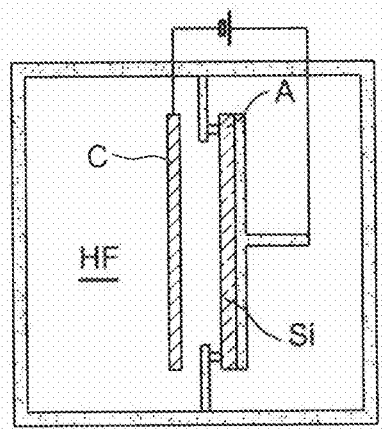

In FIGS. 16C to 16C, several porosification facilities by electrochemical way can be seen.

The facility comprises an enclosure wherein the electrochemical reaction takes place, A refers to the anode, C refers to the cathode, the substrate is referred to as Si. The hydrofluoric acid solution is referred to as HF.

The facilities of FIGS. 16A and 16B allow a porosification by photo-electrochemical way. For this, they comprise an enclosure provided with a window FT facing the back face of the substrate. A lamp L is provided facing the window outside the enclosure and illuminates the back face of the substrate. In FIG. 16A, the substrate is fully submerged in the hydrofluoric acid solution.

In FIG. 16B, the substrate is submerged in the hydrofluoric acid solution at the front face and in a liquid solution type at the back face, for example $K_2SO_4$.

In FIG. 16C, the electrical contact is directly taken at the back face of the Si substrate to be porosified, only the front face is in contact with the HF solution.

As a function of the porosification conditions, such as the nature of the electrolytic solution, the amount of current, the voltage level, the illumination, . . . and the nature of the substrate, for example its P, N-type, the doping conditions, . . . , the porous silicon can be classified into three categories as a function of the pore diameter: microporous (pore diameter<2 nm), mesoporous (2 nm<pore diameter<50 nm) or macrometric (pore diameter>50 nm).

For $P^+$-type substrates for example, the resistivity of the silicon wafer of which is in the order of a few tens mOhms.cm, the porous silicon can be directly obtained by anodization of the substrate in hydrofluoric acid.

Figure 17A:
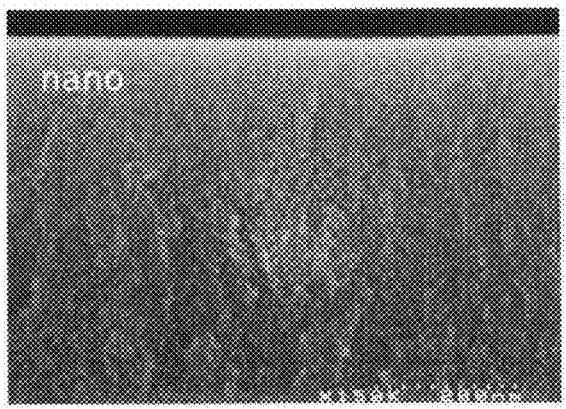
FIGS. 17A to 17C are photographs of different porous surfaces obtained by the facilities of FIGS. 16A to 16C, FIG. 18 schematically represents top and side views of a structure obtained by the process according to the invention, the contact blocks being etched during a step of defining the mechanical structure.
Figure 17B:
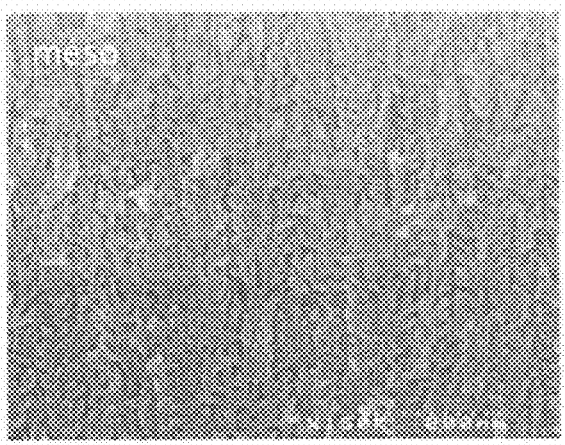
Figure 17C:
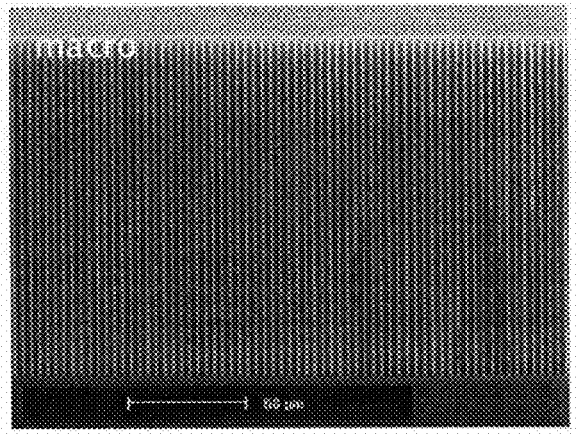

The photograph of FIG. 17A represents a microporous silicon, the photograph of FIG. 17B represents a mesoporous silicon, and the photograph of FIG. 17C represents a macroporous silicon. The photograph of FIG. 17B typically represents the type of porosity obtained in a 15% HF medium. The current density used to porosify such a material could vary from a few $mA/cm^2$ to several $A/cm^2$. By varying these parameter types, for example the HF concentration, current density, substrate type, it is possible to vary the pore diameter as well as the porosity rate. This rate can vary from 4% to 97%.

Techniques to obtain given morphological characteristics of the porous silicon (pore sizes, porosity rate and thickness) by varying the process conditions used (HF concentration, current density, illumination, silicon substrate) are well-known to those skilled in the art and will not be described in detail. Techniques for making porous silicon are disclosed in "*Formation and Application of Porous Silicon*" J. Föll, M. Christophersen, J. Carstensen, G. Hasse, *Materials Science and Engineering* R280 (2002) 1-49.

The thickness of the porous layer is mainly a function of the anodization time. It is thus possible to obtain layers of a few nanometres to several hundreds micrometres.

The porosification depth can correspond to a part of the thickness of the layer 6 (FIG. 11G) or even be equal to the thickness of the layer 6 (FIG. 11H). The area made porous is located and is referred to as ZPL.

During a following step, the locating mask 16 is withdrawn, the withdrawal is selective with respect to the porous silicon and with respect to the silicon of the layer 6. The withdrawal is performed for example by isotropic etching.

The element thus obtained is represented in FIG. 11I obtained from the element of FIG. 11G and in FIG. 11J obtained from the element of FIG. 11H.

This step of withdrawing the locating mask could be performed subsequently, for example upon making the NEMS structure or after making the NEMS structure.

During a following step, the NEMS structure is formed. For this, a mask 20 is formed on the front face of the element in of FIG. 11I, i.e. on the porous area ZPL and the still existing portions of the layer 6. This mask protects the porous area ZPL to prevent its properties from being altered during the subsequent steps as well as the portions of the layer 6 which do not to be etched. This mask is for example a silicon oxide, for example based on silane, or a silicon nitride. Preferably, the formation of this mask is performed at a low temperature, in order not to change the porosity properties of the porous silicon. This temperature is preferably lower than 450° C.

During a following step, the outlines of the NEMS structure are defined, i.e. the outline of the suspended part and the fixed part. This definition is performed for example by photolithography on the mask 20.

In the example represented, photolithography patterns are also made on the mask 20 to allow the etching of the insulation trench 30 in the active layer 6 in the vicinity of the contact blocks 14 so as to electrically insulate the NEMS structure made in the active layer 6 with respect to the contact blocks 14.

Then takes place a step of etching the hard mask 20, the layer 6 and the porous area ZPL to form the NEMS structure and of etching the insulating trench to electrically insulate the NEMS from the contact blocks.

Preferably, etching is an anisotropic etching, for example of the RIE type based on $SF_6$ for the silicon etching.

In the example represented, etching is advantageously made in the porous area. In this way, a maximum covering of porous material of the suspended part is achieved while avoiding having to accurately align the porous area with respect to the suspended part, which can be relatively complex in the case of widths of the mechanical structure and/or trenches bounding this structure having a low width, for example between a few tens nm and a few hundreds nm.

As a result of this etching in the porous area, the fixed part comprises the porous portions at its side edges oriented towards the suspended part. Thus, it is ensured that the entire suspended part 7 is covered with a porous layer.

Alternatively, as will be described below, the definition of the NEMS may not involve the etching of the porous area, for example in the case where the porous area would form only one part of the suspended part of the NEMS.

During a following step, the hard mask 20 can possibly be withdrawn. However, in the case where the process is continued by a new oxide deposition, for example for making metal interconnections, the hard mask can be kept, as is the case in the example described.

In the example described and advantageously the NEMS and the insulation trench 30 are simultaneously etched. In a variant, the NEMS and the insulating trench 30 could be successively etched, the NEMS firstly and the insulation trench secondly or reversely.

The element thus obtained is represented in FIG. 11K.

During a following step, metal interconnections are made.

For this, at the front face of the element of FIG. 11K, a layer of dielectric material 22 is formed, for example of silicon oxide. This layer 22 enables an insulation surface to be made and the surface of the element to be planarized.

Also advantageously, in the case where an etching step takes place subsequently to release the suspended part, the material of the layer 22 is selected not to leave residues upon etching with vapour hydrofluoric acid. The material of the layer 22 is for example a $SiH_4$ type silicon oxide 400° C.

The thickness of the layer 22 is selected as being sufficient to reduce the NEMS topology and ensure a sufficient electrical insulation above the layer 6 in order to allow making interconnection lines and metal pads. The thickness of the layer 22 is for example in the order of one µm for a silicon thickness of the layer 6 of 200 nm.

Preferably, the step of polishing the layer 22 takes place, for example by chemical mechanical polishing, to planarize the surface.

Steps of etching with intermediate counter-masks well-known to those skilled in the art can advantageously be performed to facilitate the CMP step.

The element thus obtained is represented in FIG. 11L.

During a following step, the areas in the layer 22 wherein the interconnections and/or contact pads intended for example for wire bonding connections with the environment will be made are bounded.

For this, a lithography is made on the layer 22.

The layer 22, possibly the hard mask if it is still present, then the porous silicon if present in the etched areas 24, which is not the case in FIG. 11L, are etched at areas bounded by lithography to reach the layer 6. In the example represented, the etchings 24 are formed flush with the fixed part 9.

The resin is then withdrawn on the layer 22.

The element thus obtained is represented in FIG. 11M.

During a following step, the interconnections and/or contact pads are made.

For this, a deposition of a conducting material is performed in the etched areas 24 to form the electrical contacts 32.

Preferably, the conducting material is selected so as to resist etching of the insulating layer 4 upon releasing the mechanical structure. The conducting material is selected for example of AlSi capable of resisting vapour hydrofluoric acid etching used to locally etch BOX forming the layer 4 in order to release the mechanical structure. Alternatively, it can be AlCu. In the case where there is no subsequent release of the mechanical structure, the conducting material is selected from the conventionally selected materials in micro and nanoelectronics.

In the case of a single metal level, AlSi is deposited on the entire surface, therefore in the etched areas 24 but also at the surface of the insulating layer 22. Then follows a chemical mechanical polishing step to keep AlSi only in the patterns 32 or then by a photolithography and etching of the AlSi layer on the surface 22 which allows the electrical contact areas to be defined (AlSi contacts with the layer 6, represented in FIGS. 11M and 11N), electrical contact pads at the surface of the layer 22, wherein these pads can be used for example for wire bonding, and electrical interconnection lines enabling both of them to be connected. For the sake of clarity, only the AlSi/layer 6 contact areas are schematized in the figures.

In the case where one or more metal levels are required, for example for networks of NEMS, polishing, for example chemical mechanical polishing steps, of the layers of deposited conducting material can be introduced in the process with a stop on the oxide. These steps enable the planarity of the surface to be kept during the process. These steps also contribute to insulating the layers from each other. These steps are besides known to make interconnections at several metal levels.

The element thus obtained is represented in FIG. 11N.

During a following step, the NEMS structure is released.

The layers 20 and 22 are withdrawn, for example through etching, at least in the area of the structure to be released in order to accede to the openings in the layer 6 and then to the sacrificial layer 4.

Then, anisotropic etching is performed, for example by vapour hydrofluoric acid of the sacrificial layer enabling the mechanical structure which is then partially suspended to be released.

The element thus obtained is represented in FIG. 11O'. In this representation, the layers 20 and 22 are etched at the mechanical structure and also around the contact blocks. In FIG. 11O" on the other hand, in order to keep the sacrificial layer around the contact blocks, a located protecting layer 28 allowing the layers 20 and 22 to be opened only at the mechanical structure to be released can be used. The located protecting layer 28 is for example of silicon formed on the layer 22, which is structured by lithography and etching before the releasing step.

Thanks to the exemplary process described above, an NEMS structure can be made electrochemically with a suspended part comprising at least one porous part and thus one can benefit from the advantages of this porosification technique, i.e. a good control of the formation speeds of the porous material, porosity rates, pore diameters, particular orientations of the pores, etc.

Another exemplary process for making a porous area according to the present invention will now be described, wherein one part of the steps is schematized in FIGS. 12A to 12D.

In this example, the starting substrate does not comprise the active conducting layer.

A conducting or semi-conducting support substrate 102 is used whereon a layer of insulating material 104 is formed, for example of silicon oxide, the thickness of which is for example between a few tens nm to a few tens μm. This layer will be subsequently used to release the mechanical structure.

Figure 12A:
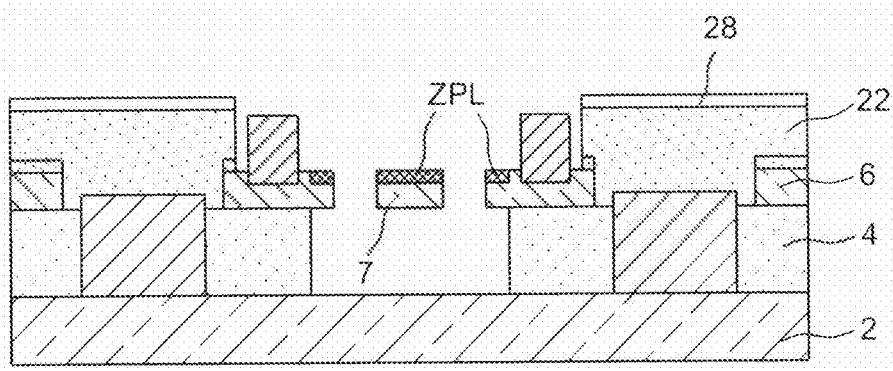
FIGS. 12A to 12D are schematic representations of some steps of another exemplary making process according to the invention.
Figure 12A:
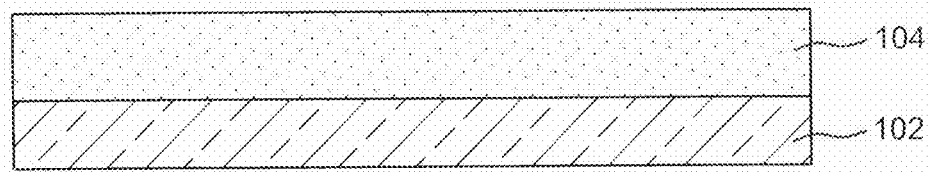

The element thus obtained is represented in FIG. 12A.

During a following step, the insulating layer 104 is structured so as to make holes or trenches 112 to receive the contact blocks. The structuration is performed for example by photolithography so as to open the layer 104. The bottom of the holes or trenches is formed by the support substrate 102.

Figure 12B:
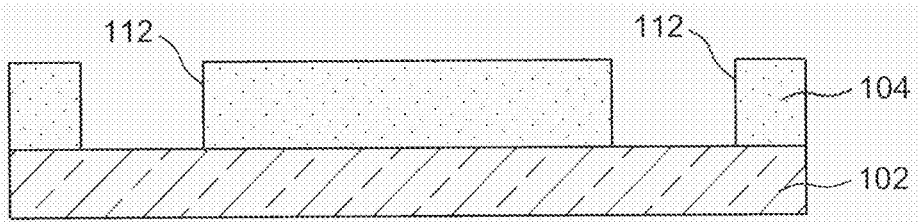

The element thus obtained is represented in FIG. 12B.

During a following step, the contact blocks 14 and the active layer 106 are both formed, for example by non-selective epitaxy, for example of Si such that the epitaxied material makes the electrical contact between the support substrate 102 and the active layer 106. Alternatively, two separated steps could be implemented: a step for making the contacts, another step for making the active layer.

Preferably, a planarization of the active layer 106 then takes place, for example through CMP.

It is to be noted that after epitaxy on the support substrate 102 and the insulating layer 104, the silicon of the contact blocks is single crystal in the case where the support 2 is itself single crystal and the silicon of the active layer 104 above the insulating layer 104, herein of silicon oxide, is of the polycrystalline type. The NEMS structure which will be made in the active layer 106 will then be of polycrystalline silicon in that case.

Other electrical conducting materials to form the contact blocks and the active layer can be contemplated, such as metals for example. Further, they can also be deposited by other techniques, by CVD, PVD, evaporation, spraying, etc.

As for the process of FIGS. 11A to 11O", the contact blocks can be made in several layers offering a sufficient conduction.

In the example described above, the active layer 106 is made simultaneously to the contact blocks 14 by epitaxy. Alternatively, it can be made by deposition. It may be contemplated to make it according to a different technique from that used to form the contact blocks, for example by techniques of transferring layers or substrate. The contact blocks and the active layer can be made of different materials.

Figure 12C:
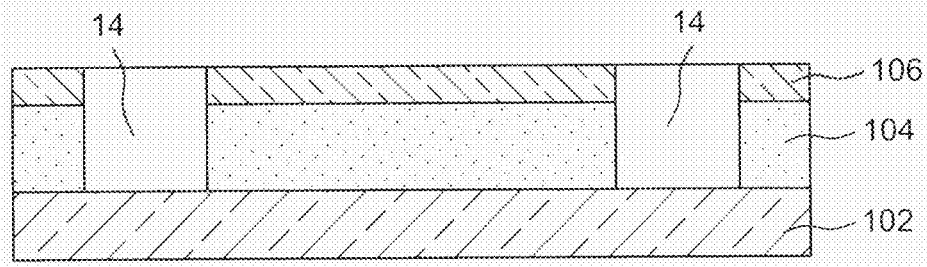

The element thus obtained is represented in FIG. 12C.

Figure 12D:
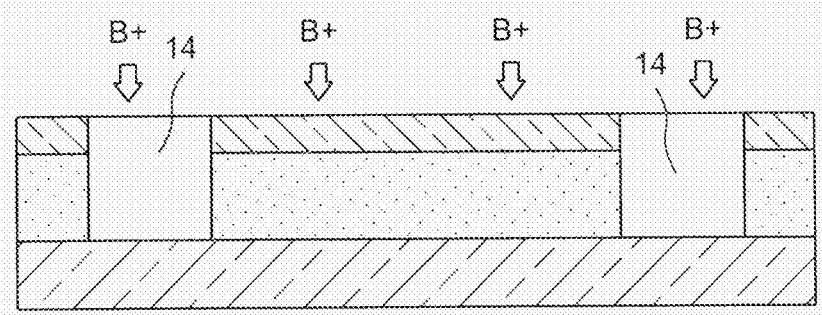

During a following step and as is schematized in FIG. 12D, the active layer 106 can be advantageously doped in a similar way as the step of FIG. 11A. The details of this step will not be repeated.

The element obtained differs from that of FIG. 11E, in that the contact blocks are not projecting from the active layer 106.

The following steps to make a device such as those of FIGS. 2A to 10B are similar to the steps of FIGS. 11F to 11O" and will not be repeated.

A located or not located porous area can be made in all or part of the active layer.

Then, it can undergo the same steps to make the NEMS structure.

Figure 18:
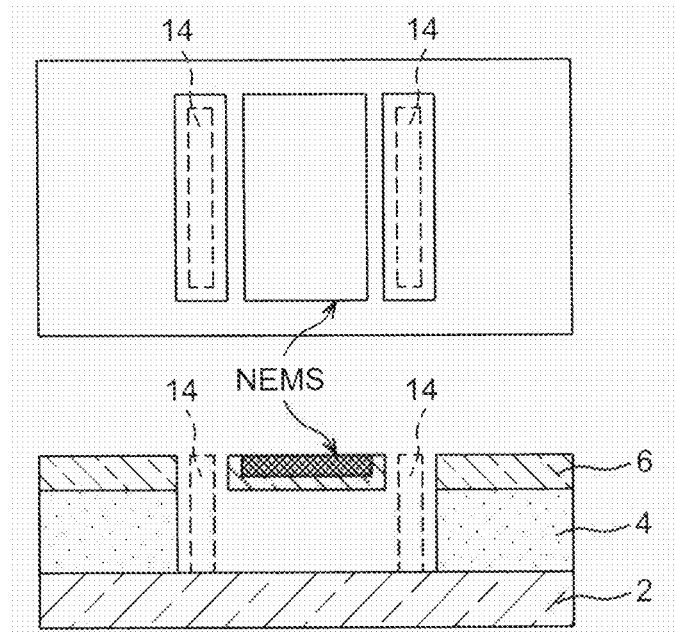

Another exemplary making process according to the invention will now be described wherein the electrical contact blocks between the active layer 6 and the support layer 2 are not kept, part of the steps of which is schematized in FIGS. 13A to 13L. In this process, the contact blocks are formed in the areas intended to be etched thereafter to define the NEMS structure and not on the perimeter of the NEMS structures, as shown in FIG. 18. The contact blocks 14 are represented in a dotted line. This process yields an overall space saving. Besides, the contact blocks are removed; at least partly, during the step of etching the layer 6 which enables the NEMS structure to be defined, which results in a time saving. This process is applicable if there is first an SOI substrate or there is first a substrate not comprising first an active layer as has been described in connection with FIGS. 12A to 12D.

Figure 13A:
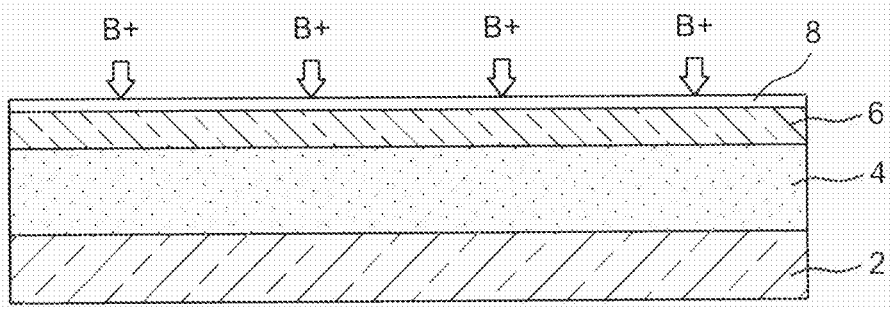
FIGS. 13A to 13L are schematic representations of the different steps of another exemplary making process according to the invention.
Figure 13B:
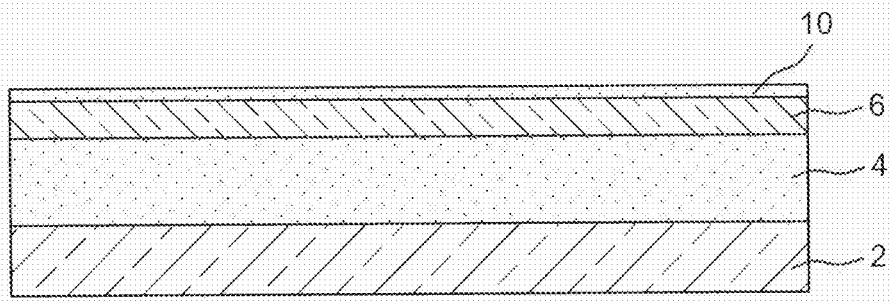

In the example which is described in the continuation, as for the process of FIGS. 11A to 11O", the starting substrate is an SOI substrate. The steps represented in FIGS. 13A and 13B are similar to those of the process of FIGS. 11A and 11B and will not be described again.

During a following step, the stack is etched to form holes 212 for the contact blocks. The making steps are similar to those described in connection with FIG. 11C. In this example, the holes are made as close as possible to the area to be porosified and, more particularly, in the area(s) intended to be etched to form the NEMS structure and possibly release it.

Figure 13C:
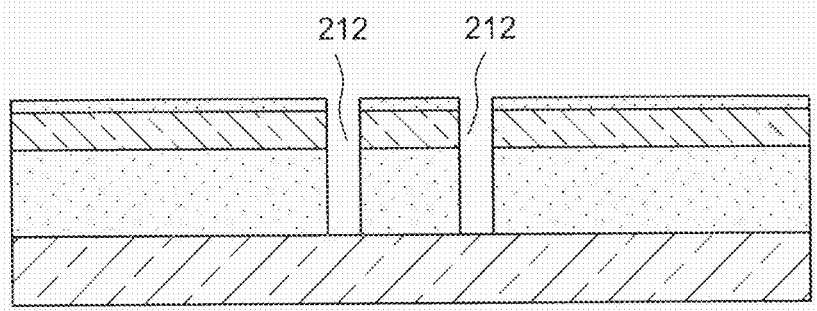

The element thus obtained is represented in FIG. 13C.

During a following step, the contact blocks 214 are made in a similar way to the process steps described in connection with FIGS. 11D and 11E, preferably by selective epitaxy.

Figure 13D:
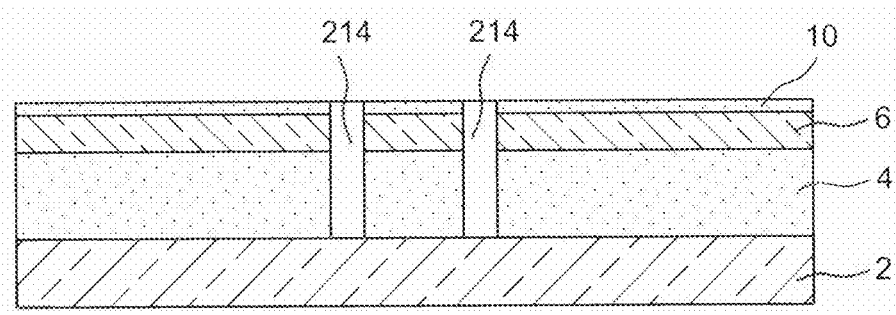
Figure 13E:
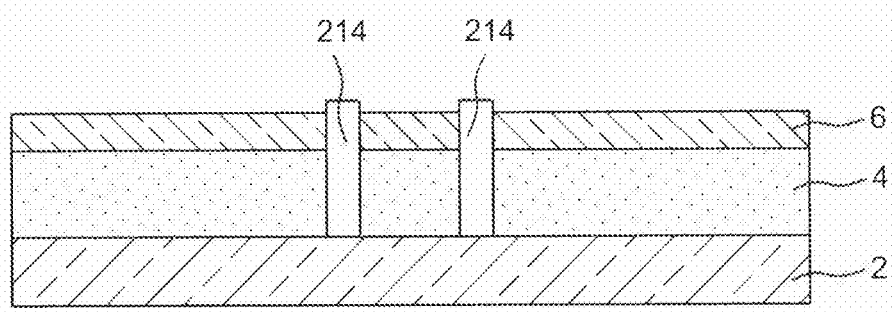
Figure 13F:
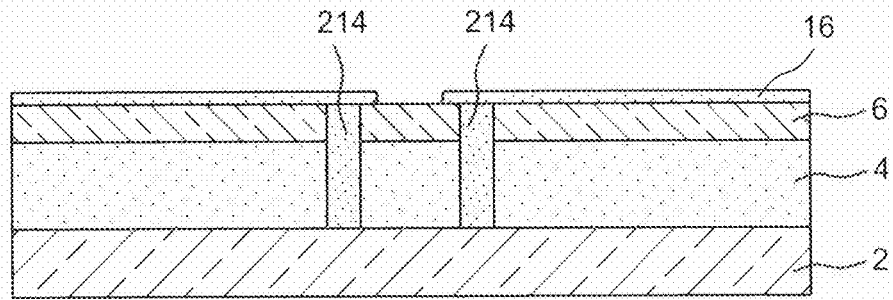
Figure 13G:
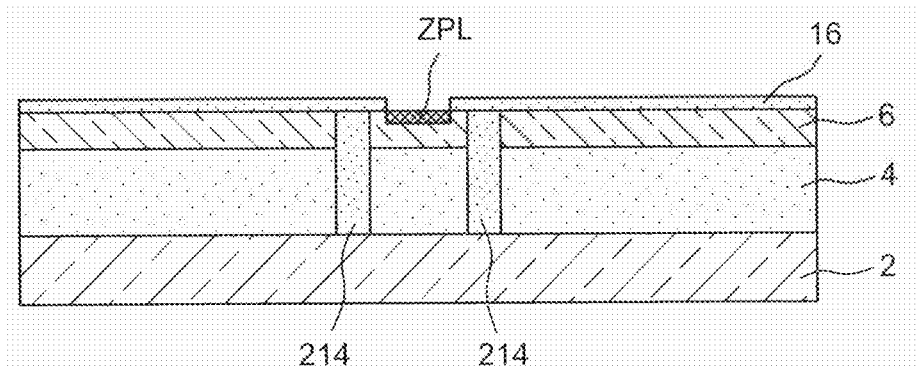

The element thus obtained is represented in FIG. 13D.

The steps represented in FIGS. 13E to 13H are similar to those of FIGS. 11E, 11F, 11G and 11I. It is to be noted that the layer 16 should have a step in making the FIGS. 13F and 13G, but since it does not intervene in the process, it will not be represented.

Figure 13H:
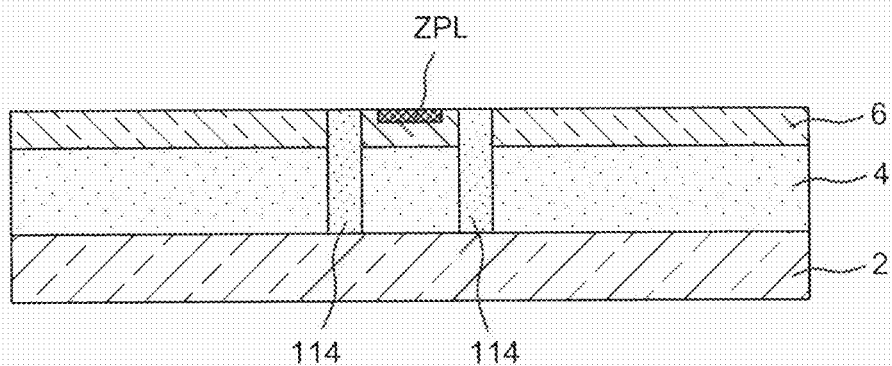

The element thus obtained is represented in FIG. 13H.

During a following step, trenches defining the NEMS structure are made, these trenches are made at the contact blocks thus also acting as electrically insulating trenches 30 between the NEMS and the contact pads. Thus, they are also etched, and the active layer and the contact blocks are no longer in contact with each other.

Figure 13I:
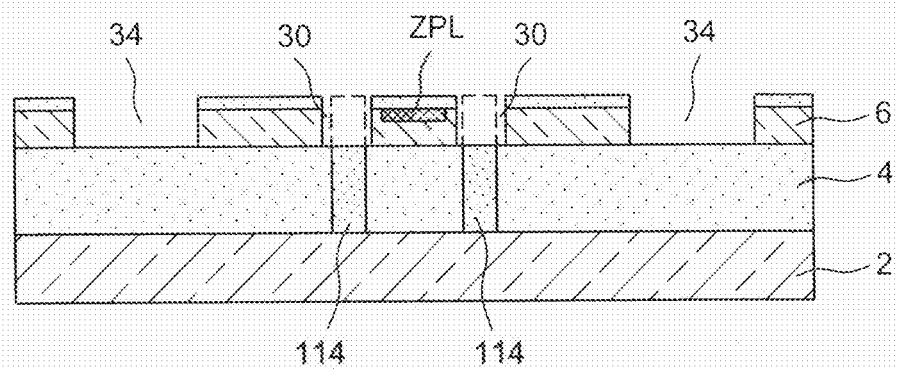

Only the part of the contact blocks lying in the active layer can be etched as is represented in FIG. 13I.

It is also contemplatable to etch the contact blocks throughout their height in order to remove them entirely (FIG. 13J), possibly by adding a further photolithography step for protecting the rest of the structure during this second etching step.

If an NEMS structure is desired to be made with at least one partially suspended part, an anisotropic etching step of the insulating layer 4 can be made at the NEMS structure.

Prior to this releasing step, it can be provided to make contacts and/or metal connections enabling the NMES structure to be connected to the electrical pads used to connect the device to the external environment in a manner known to those skilled in the art, for example in the plane of the active layer 6.

Figure 13J:
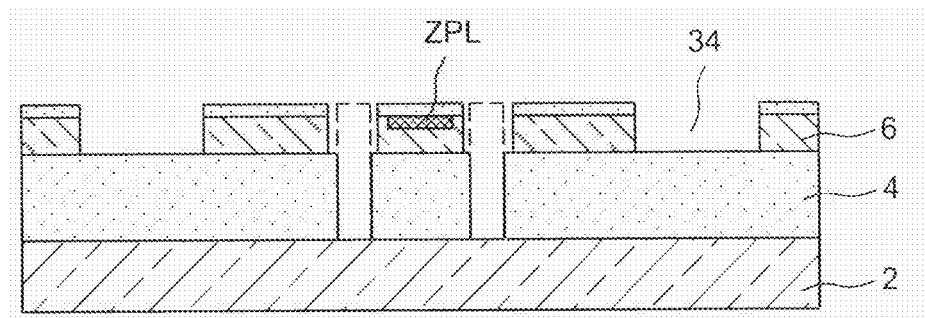

Further, it is possible to etch the active layer around the NEMS structure in order to insulate it from other NEMS structures, which otherwise would be in electrical contact with the active layer In FIGS. 13I and 13J, a trench 34 ensuring this insulation between the NEMS structures is formed.

In a similar manner as that of the process of FIGS. 11L to 11O", metal interconnections can be made. These steps will not be repeated.

Figure 13K:
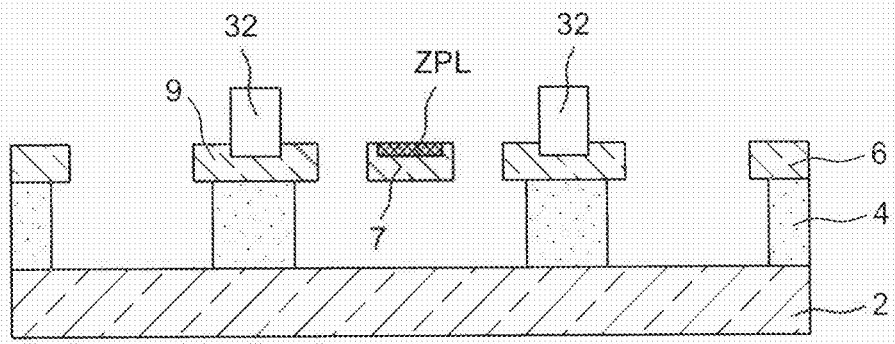
Figure 13L:
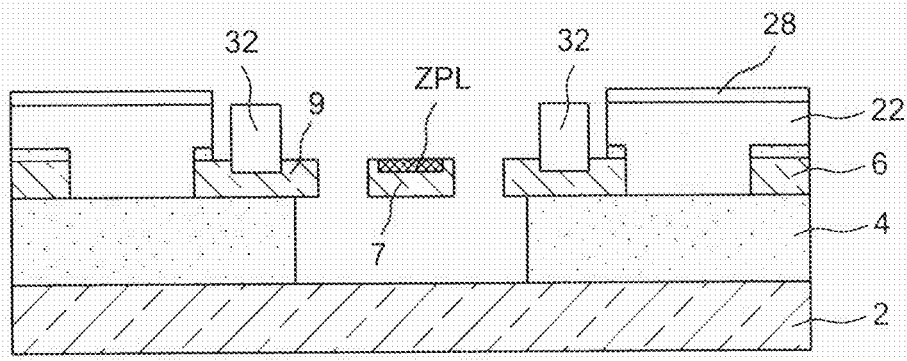

FIGS. 13K and 13L are similar to FIGS. 11O' and 11O".

Making the contact blocks in the areas for structuring the NEMS structure allows etching the NEMS structure to be defined and the electrical contact between the active layer and the support substrate to be removed simultaneously. On the other hand, this creation requires a very accurate alignment if the dimensions of the devices are very small, for example in the order of a few tens nm to a few hundreds nm.

In the examples of the processes of FIGS. 11A to 11O" and 12A to 12D, the contact blocks are in zones the location of which with respect to mechanical structure is such that it does not impose strong requirements to the shape and manufacture thereof. Indeed, the contact blocks are made in the periphery of the mechanical structure and the at least partial removal thereof does not require an accurate alignment with respect to the mechanical structure.

Another exemplary making process will now be described which differs from processes of FIGS. 11A to 11O" and 12A to 12D, in the manner in which the electrical insulation between the layer 2 and the layer 6 is made. This process is particularly interesting in the case of a collective manufacture. The making steps are otherwise identical or similar to steps 11A to 11J.

In this example, several NEMS structures are collectively made. The contact blocks are made in areas intended to be removed upon separating the NEMS structures.

Figure 14A:
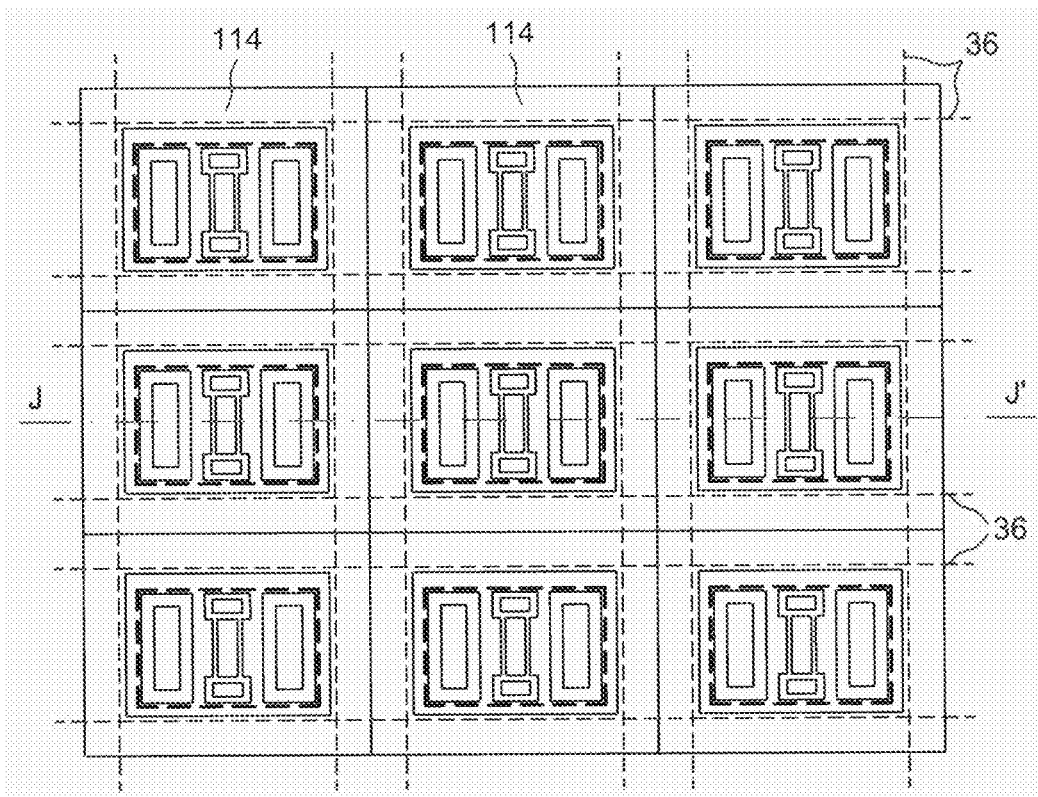
FIGS. 14A and 14B are top and cross-section views along the plane J-J' respectively of a substrate wherein several microelectronic or nanoelectronic structures have been made by virtue of the process according to the invention.

In FIG. 14A, a substrate on which several mechanical structures have been simultaneously made can be seen.

The contact blocks 114 which are in the form of a frame, surround the mechanical structures and are located outside the fixed part of the mechanical structures. The contact blocks form a meshing, the mechanical structures being located inside the meshes. Each contact block therefore contributes to porosification of two porous areas.

Any other meshing form can be implemented depending on the configuration of the mechanical structures and their relative arrangements.

The separation of the mechanical structures is made so as to remove the contact pads, thus both the separation of the NEMS structures and the electrical insulation of the layer 2 and the active layer 6 are made.

Figure 14B:
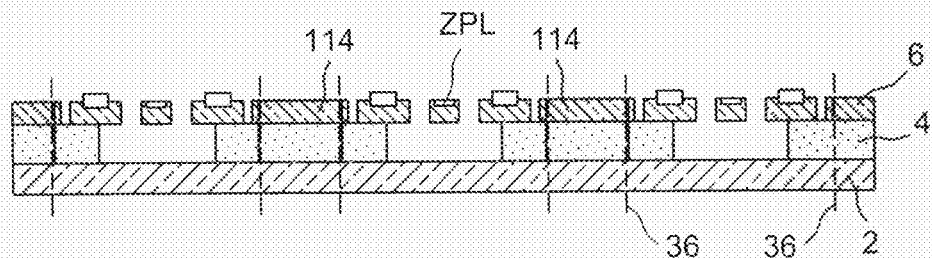

The separation of the mechanical structures is for example achieved by a sawing operation. For example, the saw blade has a width at least equal to that of the contact pads 114 and is introduced into the contact pads, which are then removed. Or a saw cut is made on either side of the contact pads as is schematized in FIGS. 14A and 14B. The contact pads are then separated from the mechanical structures. The saw cuts are symbolized by the broken lines 36.

The MEMS or NEMS type devices thus made can have any type of application, in particular they can form moisture sensors, gas sensors, chemical sensors, biological sensors, inertial sensors, have optical, thermal functions.

In the examples described, the contact blocks stop at the support layer 2, but is it contemplatable to make one or more contact blocks penetrating, or even passing through the support layer 2.

Figure 19:
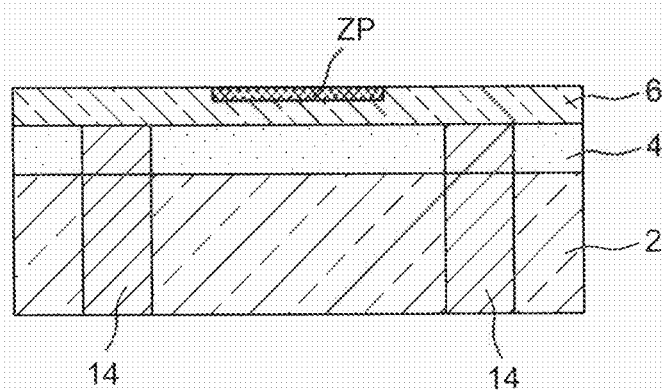
FIG. 19 is a side view of a structure obtained by the process according to the invention wherein the contact blocks are made from the back face.

Further, it can be contemplated making the contact blocks from the back face as is schematized in FIG. 19. In this example, the contact blocks 14 stop at the active layer 6. The following porosification steps are unchanged. If an electrical insulation is desired between the active layer and the support layer, the contact blocks are entirely or partly etched from the back face.

Finally, to interrupt the contact between the active layer and the contact block, it can be contemplated etching a trench directly in the contact block to insulate it from the rest of the active layer.

The invention claimed is:

1. A process for making at least one porous area in at least one part of a first layer of a material that conducts electricity of an electronic structure, said first layer forming a front face of a stack, said stack comprising a back face of a material that conducts electricity and an electrically insulating layer interposed between the first layer and the back face, said process comprising the steps of:
   a) making at least one electrical contact between the back face and the first layer, which forms an electrical conductive path that carries an electrical current from within the conducting material of the back face to the first layer, by forming at least one contact block of a material that conducts electricity through the insulating layer,
   b) placing the stack into an electrochemical bath, and
   c) applying an electrical current between the back face and the first layer through the at least one contact block so as to cause porosification of at least one area of the first layer,
   said conducting material of the back face including
      a metal,
      a N-type or P-type semi-conductor, or a compound or a multilayer of a metal and a N-type or P-type semi-conductor.

2. The process according to claim 1, wherein the at least one contact block is formed from the front face and/or from the back face.

3. The process according to claim 1, comprising after step c), a step d) of forming the electronic structure from the first layer.

4. The process according to claim 3, wherein step d) comprises a sub-step of etching the first layer and a step of at least partially withdrawing the at least one contact block that takes place simultaneously to etching the first layer.

5. The process according to claim 3, wherein the at least one contact blocks surround the area wherein the electronic structure is made.

6. The process according to claim 3, wherein the electronic structure comprises at least one suspended part and a fixed part, in which process the porous area is formed at least partly on the suspended part and at least partly on the fixed part.

7. The process according to claim 3, wherein the electronic structure comprises at least one suspended part and a fixed part, in which process the at least one contact block is made in an area between the fixed part and the suspended part.

8. The process according to claim 3, wherein step d) comprises making interconnections on the first layer comprising the sub-steps of:
forming a dielectric layer on the porous area and the first layer,
forming a mask on the dielectric layer,
etching the mask and the dielectric layer up to the first layer to form etched areas, and
forming and structuring a conducting material in the etched areas to form the interconnections.

9. The process according to claim 1, wherein the stack is an SOI substrate.

10. The process according to claim 1, wherein the at least one electrical contact between the first layer and the back face is removed after step c).

11. The process according to claim 10, wherein the step of removing the at least one electrical contact is achieved by at least partially withdrawing the at least one contact block so as to remove a mechanical contact between the first layer and/or the back face and the contact block.

12. The process according to claim 10, wherein the at least one contact block is partially etched.

13. The process according to claim 10, wherein the first layer is etched around the at least one contact block.

14. The process according to claim 10, wherein the at least one contact block is withdrawn by sawing.

15. The process according to claim 1, wherein step a) comprises making at least one hole through the stack between the back face and the first layer, through the insulation layer and filling said hole with a material that conducts electricity so as to form the at least one contact block making an electrical contact between the back face and the first layer.

16. The process according to claim 15, wherein filling said hole by a material that conducts electricity is preferably achieved by selective or non-selective epitaxy, by electrolysis or by chemical vapor deposition (CVD).

17. The process according to claim 1, wherein prior to step a), at least one hole is made in the insulation layer reaching the back face and during step a), the first layer and the at least one contact block are simultaneously formed onto the insulating layer and in the hole respectively.

18. The process according to claim 17, wherein forming the first layer and the at least one contact block is performed through epitaxy.

19. The process according to claim 1, wherein the material of the at least one contact block and that of the first layer are the same.

20. The process according to claim 1, wherein the back face is made of silicon and the at least one contact block is made of silicon, through epitaxy on the back face.

21. The process according to claim 1, wherein, during step a), several distinct contact blocks are made in proximity to the area to be porosified.

22. The process according to claim 1, wherein, during step a), a single contact block having a closed outline is made, the area to be porosified being inside and/or outside the closed outline.

23. The process according to claim 1, wherein, during step a), a single contact block having a discontinuous outline is made, the area to be porosified being inside and/or outside the discontinuous outline, or a plurality of contact blocks bounding an area between each other is made, the area to be porosified being inside and/or outside said area.

24. The process according to claim 1, wherein during step c), the entire surface of the first layer is porosified and/or the first layer is porosified throughout its thickness.

25. The process according to claim 1, wherein prior to step c), a location layer is formed at least on the first layer to bound at least one area of the first layer to be porosified.

26. The process according to claim 1, wherein the stack comprises one or more layers between the back face and the insulating layer such that an electrical continuity between the back face and the first layer is ensured after step a).

27. The process according to claim 1, wherein several electronic structures are made and wherein the at least one contact block is made between the areas wherein the electronic structures are made.

28. The process according to claim 27, wherein the at least one electrical contact between the first layer and the back face is removed after step c) by separating the electronic structures.

29. The process according to claim 28, wherein separating the electronic structures is achieved by sawing, by two saw cuts on either side of the contact pads so as to separate the at least one contact block from the electronic structures or by a saw cut having a width at least equal to the transverse dimension of the at least one contact block.

30. The process according to claim 1, wherein step a) includes making at least one hole starting at a side opposite to the back face without going through the back face, such that the hole is made through the stack between the back face and the first layer, through the insulation layer and filling said hole with a material that conducts electricity so as to form the at least one contact block making an electrical contact between the back face and the first layer.

31. The process according to claim 1, wherein the back face is made of:
a semi-conducting material, in a single crystal, polycrystalline, amorphous form, that is one of Si, Ge, and SiGe;
a metal that is one of Al, W, Cu, and Au; or
compounds or multilayers of the semi-conducting material and metal.

32. The process according to claim 1, wherein the back face is the N-type or P-type semi-conductor.

* * * * *

UNITED STATES PATENT AND TRADEMARK OFFICE
CERTIFICATE OF CORRECTION

| | |
|---|---|
| PATENT NO. | : 10,563,319 B2 |
| APPLICATION NO. | : 14/514703 |
| DATED | : February 18, 2020 |
| INVENTOR(S) | : Eric Ollier et al. |

It is certified that error appears in the above-identified patent and that said Letters Patent is hereby corrected as shown below:

On the Title Page

Item (73), the Assignee's name is incorrect. Item (73) should read:
-- (73) Assignee: COMMISSARIAT A L'ENERGIE ATOMIQUE ET AUX ENERGIES ALTERNATIVES, Paris (FR) --

Signed and Sealed this
Thirty-first Day of March, 2020

Andrei Iancu
*Director of the United States Patent and Trademark Office*